(12) United States Patent
Kurokawa

(10) Patent No.: US 8,953,354 B2
(45) Date of Patent: Feb. 10, 2015

(54) SEMICONDUCTOR MEMORY DEVICE AND METHOD OF DRIVING SEMICONDUCTOR MEMORY DEVICE

(75) Inventor: Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 315 days.

(21) Appl. No.: 13/488,517

(22) Filed: Jun. 5, 2012

(65) Prior Publication Data

US 2012/0314513 A1    Dec. 13, 2012

(30) Foreign Application Priority Data

Jun. 9, 2011    (JP) ................................. 2011-129142

(51) Int. Cl.
  *G11C 7/10*    (2006.01)
  *G11C 7/22*    (2006.01)
  *G11C 15/04*   (2006.01)
  *G06F 12/08*   (2006.01)

(52) U.S. Cl.
  CPC ............... *G11C 7/1006* (2013.01); *G11C 7/22* (2013.01); *G11C 15/04* (2013.01); *G06F 12/0864* (2013.01); *G06F 12/0893* (2013.01); *G11C 2207/2245* (2013.01); *Y02B 60/1225* (2013.01)
  USPC ............. 365/49.16; 365/189.07; 365/230.03; 365/49.17; 365/49.11; 365/189.02; 711/108; 711/122; 711/128; 711/129; 711/145

(58) Field of Classification Search
  USPC ................. 365/189.02, 189.07, 230.03, 49.1, 365/49.11, 49.15, 49.17, 49.16; 711/108, 711/122, 128, 129, 145, 209, 216
  See application file for complete search history.

(56) References Cited

U.S. PATENT DOCUMENTS

| | | | | |
|---|---|---|---|---|
| 4,599,709 A | * | 7/1986 | Clemons | 365/200 |
| 5,255,228 A | * | 10/1993 | Hatta et al. | 365/200 |
| 5,353,424 A | * | 10/1994 | Partovi et al. | 711/128 |
| 5,528,032 A | | 6/1996 | Uchiyama | |
| 5,734,914 A | | 3/1998 | Nakamura et al. | |

(Continued)

FOREIGN PATENT DOCUMENTS

| | | |
|---|---|---|
| JP | 01-233537 A | 9/1989 |
| JP | 01-290051 A | 11/1989 |

(Continued)

OTHER PUBLICATIONS

Kim.H et al., "Three-Dimensional Integration Approach to High-Density Memory Devices", IEEE Transactions on Electron Devices, Nov. 1, 2011, vol. 58, No. 11, pp. 3820-3828.

(Continued)

*Primary Examiner* — J. H. Hur
(74) *Attorney, Agent, or Firm* — Fish & Richardson P.C.

(57) ABSTRACT

A semiconductor memory device includes a memory portion that includes i (i is a natural number) sets each including j (j is a natural number of 2 or larger) arrays each including k (k is a natural number of 2 or larger) lines to each of which a first bit column of an address is assigned in advance; a comparison circuit; and a control circuit. The i×j lines to each of which a first bit column of an objective address is assigned in advance are searched more than once and less than or equal to j times with the use of the control circuit and a cache hit signal or a cache miss signal output from the selection circuit. In such a manner, the line storing the objective data is specified.

12 Claims, 12 Drawing Sheets

(56) References Cited

U.S. PATENT DOCUMENTS

| | | | |
|---|---|---|---|
| 5,761,715 A | 6/1998 | Takahashi | |
| 5,796,671 A * | 8/1998 | Wahlstrom | 365/230.03 |
| 5,845,309 A | 12/1998 | Shirotori et al. | |
| 5,870,616 A | 2/1999 | Loper et al. | |
| 5,892,724 A * | 4/1999 | Hasegawa et al. | 365/230.03 |
| 6,349,364 B1 * | 2/2002 | Kai et al. | 711/133 |
| 6,385,697 B1 * | 5/2002 | Miyazaki | 711/128 |
| 6,684,298 B1 | 1/2004 | Dwarkadas et al. | |
| 6,807,077 B2 | 10/2004 | Noda et al. | |
| 6,987,682 B2 | 1/2006 | Ma et al. | |
| 7,069,388 B1 | 6/2006 | Greenfield et al. | |
| 7,257,678 B2 | 8/2007 | Golden et al. | |
| 7,418,553 B2 | 8/2008 | Yoshimi | |
| 7,437,513 B2 | 10/2008 | Saida et al. | |
| 7,443,717 B2 | 10/2008 | Fujita et al. | |
| 7,502,887 B2 | 3/2009 | Tanaka et al. | |
| 7,606,976 B2 | 10/2009 | Raghuvanshi | |
| 7,674,650 B2 | 3/2010 | Akimoto et al. | |
| 7,818,502 B2 | 10/2010 | Kurokawa | |
| 7,882,379 B2 | 2/2011 | Kanakogi | |
| 7,929,332 B2 | 4/2011 | Fujita | |
| 2002/0184445 A1 * | 12/2002 | Cherabuddi | 711/130 |
| 2003/0131183 A1 * | 7/2003 | Rappoport et al. | 711/5 |
| 2004/0141363 A1 | 7/2004 | Ohtsuka et al. | |
| 2004/0184340 A1 | 9/2004 | Dwarkadas et al. | |
| 2005/0002232 A1 * | 1/2005 | Cernea | 365/185.01 |
| 2005/0146915 A1 | 7/2005 | Koide | |
| 2005/0146947 A1 | 7/2005 | Higeta et al. | |
| 2006/0262633 A1 | 11/2006 | Ramaraju et al. | |
| 2008/0315286 A1 | 12/2008 | Ieda | |
| 2009/0077319 A1 | 3/2009 | Kurokawa | |
| 2009/0168499 A1 * | 7/2009 | Kushida et al. | 365/156 |
| 2009/0172289 A1 * | 7/2009 | Yamamura et al. | 711/128 |
| 2010/0149202 A1 * | 6/2010 | Yoshikawa | 345/557 |
| 2011/0101351 A1 | 5/2011 | Yamazaki | |
| 2011/0121878 A1 | 5/2011 | Kato et al. | |
| 2011/0122670 A1 | 5/2011 | Yamazaki et al. | |
| 2011/0128777 A1 | 6/2011 | Yamazaki et al. | |
| 2011/0134683 A1 | 6/2011 | Yamazaki et al. | |
| 2011/0148463 A1 | 6/2011 | Kato et al. | |
| 2011/0156025 A1 | 6/2011 | Shionoiri et al. | |
| 2011/0176357 A1 | 7/2011 | Koyama et al. | |
| 2011/0187410 A1 | 8/2011 | Kato et al. | |
| 2011/0228602 A1 | 9/2011 | Saito et al. | |
| 2011/0284838 A1 | 11/2011 | Saito | |
| 2012/0051118 A1 | 3/2012 | Yamazaki et al. | |
| 2012/0314512 A1 | 12/2012 | Kurokawa | |

FOREIGN PATENT DOCUMENTS

| | | |
|---|---|---|
| JP | 06-275697 A | 9/1994 |
| JP | 2000-215104 A | 8/2000 |
| JP | 2004-185576 A | 7/2004 |
| JP | 2007-123861 A | 5/2007 |
| JP | 2008-269751 A | 11/2008 |

OTHER PUBLICATIONS

Patterson.D et al., "Cache Performance", Computer Architecture a Quantitative Approach, Second Edition, 1996, pp. 384-386, Morgan Kaufmnn Publishers.

Hennessy.J et al., Computer Architecture a Quantitative Approach 3rd Edition, 2003, pp. 393-395, Morgan Kaufmnn Publishers.

* cited by examiner

● In
☾ Sn
☽ Zn
• O

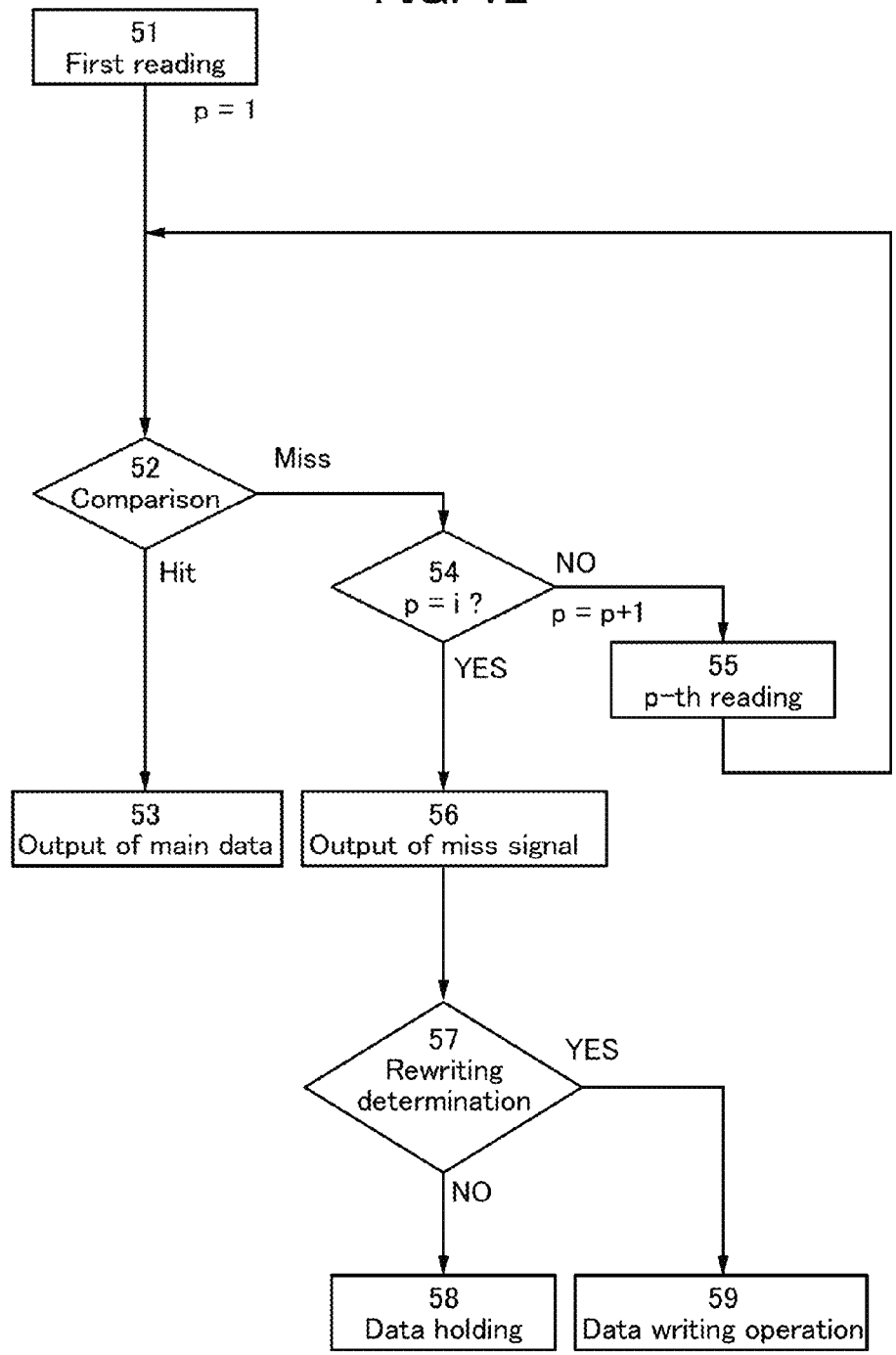

SEMICONDUCTOR MEMORY DEVICE AND METHOD OF DRIVING SEMICONDUCTOR MEMORY DEVICE

BACKGROUND OF THE INVENTION

1. Field of the Invention

The present invention relates to a semiconductor memory device and a method of driving the semiconductor memory device. In particular, the present invention relates to a semiconductor memory device that is applicable to a cache and a method of driving the semiconductor memory device.

2. Description of the Related Art

Many central processing units (CPU) include a control circuit and a memory circuit called a cache memory in addition to an arithmetic unit. When a high-speed cache memory is provided in a central processing unit, the frequency of access to a low-speed main memory such as a dynamic random access memory (DRAM) provided outside the central processing unit can be reduced. As a result, the processing speed of the central processing unit can be increased.

A structure and a method of driving the cache memory are described with reference to an n-way set associative cache memory.

The n-way set associative cache memory includes n (n is a natural number) sets, n comparison circuits each comparing tags, and a selection circuit selecting data. Note that one set and one comparison circuit are paired. Each set includes a plurality of regions called lines. In order to specify each of the lines uniquely with a first bit column of an address of the main memory, a first bit column is assigned in advance to each of the lines. Therefore, the number of lines is less than or equal to m (m is a natural number of 2 or larger) that can be specified with the first bit column of the address of the main memory. Note that each line includes a tag field storing a second bit column of the address and a data field storing copy data of the main memory.

First, an example of a method of storing single data which is specified with the address in the n-way set associative cache memory is described. A control circuit of a central processing unit selects lines to each of which the first bit column of the address is assigned in advance in the respective sets with reference to the first bit column of the address of the single data so that the single data can be stored in the lines. That is, in the n-way set associative cache memory, n lines are selected in total for single data.

Next, the control circuit specifies the line in which the oldest data is stored among the n lines, and the single data is overwritten to this line. Specifically, the second bit column of the address is stored in the tag field, and copy data of the main memory is stored in the data field.

Next, an example of a method of extracting specific data from the n-way set associative cache memory is described. When an arithmetic unit requests specific data from the control circuit, the control circuit seeks the line in which the data is stored using the first bit column and the second bit column of the address for specifying the data.

Specifically, the control circuit selects the n lines to each of which the first bit column of the address for specifying the data is assigned in advance. Next, the second bit columns stored in the tag fields of the selected lines are compared with the second bit column of the address for specifying the data by the comparison circuits connected to the respective sets. In the case where these match each other (this case is referred to as cache hit), the selection circuit outputs data stored in the data field of the line with which a cache hit is obtained to the control circuit together with a cache hit signal. Note that in the case where the requested data is not found in the n lines (this case is referred to as cache miss), the selection circuit outputs a cache miss signal to the control circuit and the arithmetic processing unit of the central processing unit requests data from the main memory.

A transistor including an oxide semiconductor in a channel formation region has been known (Patent Document 1). Since an oxide semiconductor layer can be comparatively easily formed by a sputtering method or the like, the transistor including an oxide semiconductor in a channel formation region can be easily formed.

REFERENCE

Patent Document

[Patent Document 1] Japanese Published Patent Application No. 2007-123861

SUMMARY OF THE INVENTION

When a cache miss occurs, the processing speed becomes low because the central processing unit accesses a low-speed external main memory such as a DRAM. Therefore, a structure with which a cache miss is prevented and a cache hit can be easily obtained has been researched. As one of measures to achieve this, a structure in which the number of sets is increased so that the storage capacity is increased is given.

However, when the number of sets is increased, the number of lines which are searched in extracting single data is increased and thus power consumed in reading operation and comparing operation is increased.

One embodiment of the present invention is made in view of the foregoing technical background. Therefore, an object is to provide a semiconductor memory device in which the frequency of access to a low-speed external memory device is reduced, which operates at high speed, and whose power consumption is reduced. Another object is to provide a method of driving the semiconductor memory device in which the frequency of access to the low-speed external memory device is reduced, which operates at high speed, and whose power consumption is reduced.

In order to achieve the above objects, one embodiment of the present invention is made with a focus on the total number of lines provided in a set and the number of lines searched in one search operation. A semiconductor memory device including the following components has been devised: a memory portion that includes i (i is a natural number) sets each including j (j is a natural number of 2 or larger) arrays each including k (k is a natural number of 2 or larger) lines to each of which a first bit column of an address is assigned in advance; a comparison portion; and a control circuit. Further, in order to achieve the above objects, a method of driving the semiconductor memory device has been devised. In the method, second bit columns of tag fields in the i×j lines to each of which a first bit column of an objective address is assigned in advance are compared with a second bit column of the objective address by the comparison portion more than or equal to once and less than or equal to j times so that the line in which data specified with the address is stored is sought. Then, a cache miss signal or a cache hit signal and main data is/are output from the comparison portion.

That is, one embodiment of the present invention is a semiconductor memory device including a memory portion including i (i is a natural number) sets each including j (j is a natural number of 2 or larger) arrays each including k (k is a natural number of 2 or larger) lines each including a tag field and a data field; a comparison portion including i comparison circuits and a selection circuit to which the i comparison circuits and the i sets are connected; and a control circuit that is connected to the selection circuit and includes an external input terminal through which an address and/or main data specified with the address are/is input and an external output terminal through a cache miss signal or a cache hit signal and main data is/are output. The i sets and the i comparison circuits are each connected to the control circuit. The i sets and the i comparison circuits form i pairs in total in each of which one set and one comparison circuit are connected to each other. K kinds of first bit columns of the address are assigned to the respective k lines. Each of the tag fields stores a second bit column of the address. Each of the data fields stores main data specified with the address. The comparison portion compares the second bit columns of the tag fields of the lines selected by the control circuit with a second bit column of an address input from the control circuit, and outputs a cache miss signal to the control circuit when the second bit column of the tag field and the second bit column of the address input from the control circuit do not match each other or outputs a cache hit signal and the main data stored in the data field of the line to the control circuit when the second bit column of the tag field and the second bit column of the address input from the control circuit match each other. In response to an address signal input through the external input terminal or the cache miss signal input from the comparison portion, the control circuit outputs, to the memory portion, a line selection signal for selecting the lines to each of which the first bit column of the input address is assigned and an array selection signal for selecting one of the j arrays, and outputs the second bit column of the input address to the comparison circuit. The control circuit outputs a cache miss signal through the external output terminal when the cache miss signal is input from the comparison portion after all of the j arrays are selected with the array selection signals. The control circuit outputs the cache hit signal and the main data through the external output terminal when the cache hit signal is input from the comparison portion.

In the memory portion of the semiconductor memory device according to one embodiment of the present invention, the j (j is a natural number of 2 or larger) arrays each including the k (k is a natural number of 2 or larger) lines to each of which the first bit column of the address is assigned in advance are provided for one set, and the i (i is a natural number) sets are included. The control circuit searches the i×j lines to each of which the first bit column of the address is assigned in advance more than or equal to once and less than or equal to j times depending on whether the case corresponds to a cache hit or a cache miss, and specifies the line in which corresponding data is stored.

In this manner, a search of the lines provided in the memory portion can be finished in response to the cache hit signal. Thus, the number of the lines searched before a cache hit is obtained can be reduced, and power consumed in reading operation and comparing operation can be reduced. As a result, a semiconductor memory device in which the frequency of access to a low-speed external memory device is reduced, which operates at high speed, and whose power consumption is reduced can be provided.

Another embodiment of the present invention is a semiconductor memory device which has the above structure and in which, in each of the sets, the j arrays are connected in series through a switch including a transistor.

With such a structure, the lengths of the signal lines do not need to be increased uselessly, and the plurality of arrays can be connected to each other using the signal lines with appropriate lengths. As a result, an increase in capacitance due to an increase in the length of a wiring can be prevented. As a result, a semiconductor memory device in which the frequency of access to a low-speed external memory device is reduced, which operates at high speed, and whose power consumption is reduced can be provided.

Another embodiment of the present invention is a semiconductor memory device which has the above structure and in which, in each of the sets, the j arrays are connected in parallel through a switch including a transistor.

With such a structure, the lengths of the signal lines do not need to be increased uselessly, and the plurality of arrays can be connected to each other using the signal lines with appropriate lengths. As a result, a semiconductor memory device in which the frequency of access to a low-speed external memory device is reduced, which operates at high speed, and whose power consumption is reduced can be provided.

Another embodiment of the present invention is a semiconductor memory device which has the above structure and further includes a switch including a transistor in which a channel formation region is formed in an oxide semiconductor layer.

The semiconductor memory device according to one embodiment of the present invention includes a switch including a transistor in which a channel formation region is formed in an oxide semiconductor layer and which has extremely small off-state leakage current.

With such a structure, the plurality of arrays can be disconnected completely. As a result, a semiconductor memory device in which the frequency of access to a low-speed external memory device is reduced, which operates at high speed, and whose power consumption is reduced can be provided.

Another embodiment of the present invention is a semiconductor memory device which has the above structure and in which each of the lines in the arrays includes a plurality of static random access memories (SRAMs).

With such a structure, high-speed reading and writing can be performed. As a result, a semiconductor memory device in which the frequency of access to a low-speed external memory device is reduced, which operates at high speed, and whose power consumption is reduced can be provided.

Another embodiment of the present invention is a method of driving a semiconductor memory device. Specifically, the method includes a first step, a second step, a third step, a fourth step, a fifth step, and a sixth step described below. In the first step, an address is input through an external input terminal of a control circuit including the external input terminal and an external output terminal, the control circuit outputs, to a memory portion including i (i is a natural number) sets each including j (j is a natural number of 2 or larger) arrays each including k (k is a natural number of 2 or larger) lines each of which includes a tag field and a data field and to which k kinds of first bit columns of an address are assigned in advance, an array selection signal for selecting one of the j arrays in the memory portion and a line selection signal for selecting the line corresponding to the address from the k lines, and a second bit column of the address is output to a comparison portion which includes i comparison circuits and a selection circuit to which the i comparison circuits and the i sets are connected, the i comparison circuits in the comparison portion and the i sets forming i pairs in total in each of which one comparison circuit and one set are connected to each other.

In the second step, the i comparison circuits of the comparison portion compare second bit columns of the tag fields of the selected i lines with the second bit column of the address input from the control circuit, and the comparison circuit outputs a cache hit signal to the selection circuit when the second bit column of the tag field and the second bit column of the address input from the control circuit match each other or outputs a cache miss signal to the selection circuit when the second bit column of the tag field and the second bit column of the address input from the control circuit do not match each other.

In the third step, in the case where one of the i comparison circuits outputs a cache hit signal, the selection circuit outputs main data stored in the data field of the line including the tag field whose second bit column matches the second bit column of the address input from the control circuit in the set connected to the comparison circuit which has output the cache hit signal, and the process proceeds to the sixth step, and in the other cases, the process proceeds to the fourth step.

In the fourth step, when all of the i comparison circuits output a cache miss signal, the comparison portion outputs the cache miss signal to the control circuit.

In the fifth step, in the case where not all of the i arrays in the memory portion have been selected, the control circuit outputs an array selection signal for selecting one of the arrays which have not been selected and the line selection signal to the memory portion and outputs the second bit column of the address to the comparison portion, and the process returns to the second step, and after all of the i arrays in the memory portion are selected, the process proceeds to the sixth step.

In the sixth step, the control circuit outputs, through the external output terminal, the cache hit signal and the main data or the cache miss signal input from the selection circuit.

In the method of driving the semiconductor memory device according to one embodiment of the present invention, the control circuit searches the i×j lines to each of which the first bit column of the address is assigned in advance more than or equal to once and less than or equal to j times depending on whether the case corresponds to a cache hit or a cache miss, and specifies the line in which corresponding data is stored.

In this manner, a search of the lines provided in the memory portion can be finished in response to the cache hit signal. Thus, the number of the lines searched before a cache hit is obtained can be reduced, and power consumed in reading operation and comparing operation can be reduced. As a result, a method of driving a semiconductor memory device in which the frequency of access to a low-speed external memory device is reduced, which operates at high speed, and whose power consumption is reduced can be provided.

Note that in this specification, the term "cache" means a memory device which is searched first by an arithmetic unit for data that can be specified with an address.

Further, in this specification, the term "Low" (L) means a potential lower than "High" (H), and corresponds to, for example, a ground potential or a low potential substantially equal to the ground potential. On the other hand, the term "High" means a potential higher than "Low", and can be set at a given value.

According to one embodiment of the present invention, a semiconductor memory device in which the frequency of access to a low-speed external memory device is reduced, which operates at high speed, and whose power consumption is reduced can be provided. Further, a method of driving the semiconductor device in which the frequency of access to the low-speed external memory device is reduced, which operates at high speed, and whose power consumption is reduced can be provided.

BRIEF DESCRIPTION OF THE DRAWINGS

FIG. 12 is a flow chart showing operation of a semiconductor memory device according to an embodiment.

DETAILED DESCRIPTION OF THE INVENTION

Figure 1:
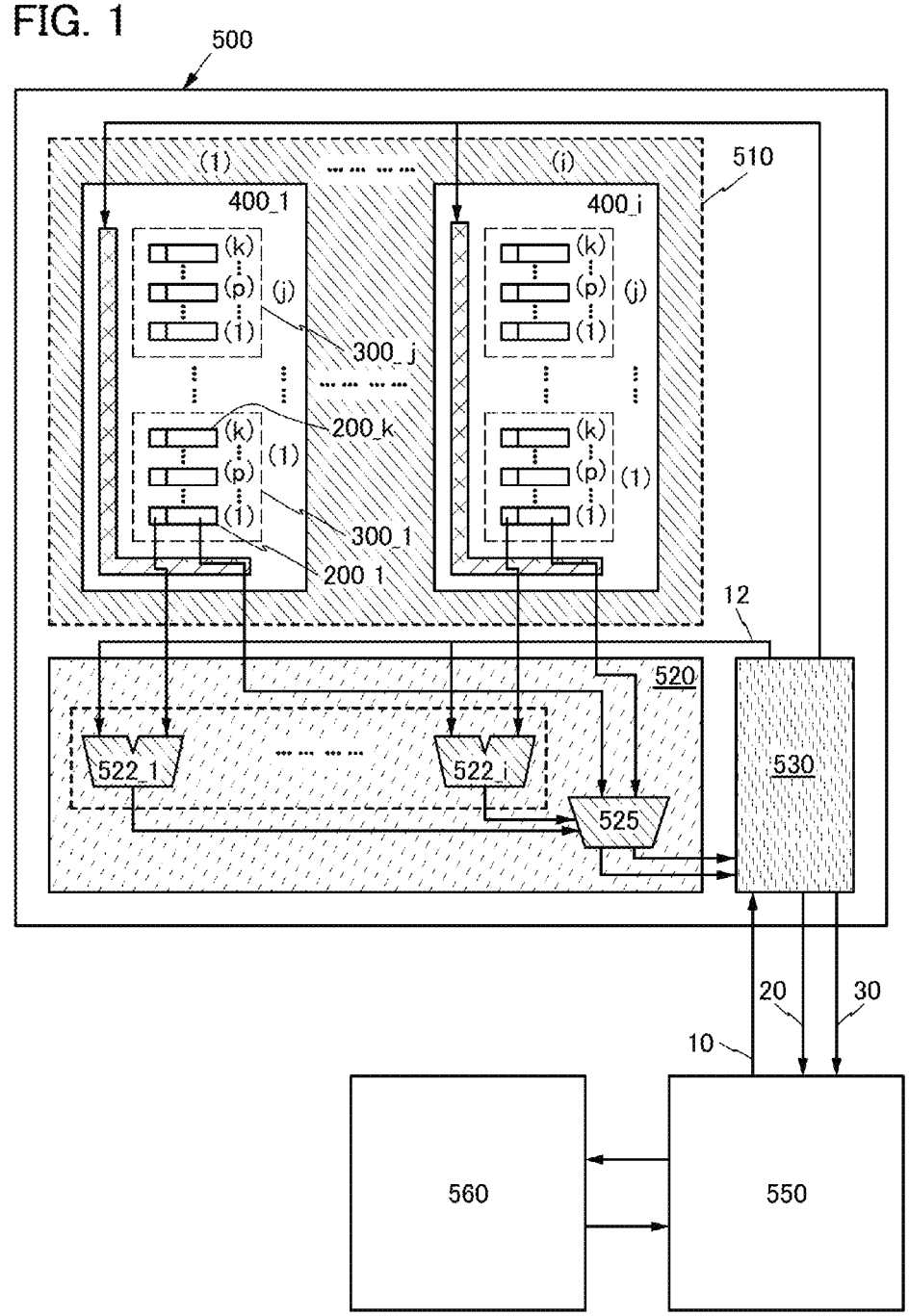
FIG. 1 illustrates a structure of a semiconductor memory device according to an embodiment.

Embodiments of the present invention will be described in detail with reference to the accompanying drawings. Note that the present invention is not limited to the following description and it is easily understood by those skilled in the art that the mode and details can be variously changed without departing from the spirit and scope of the present invention. Therefore, the present invention should not be interpreted as being limited to the description in the following embodiments. Note that in the structures of the present invention described below, the same portions or portions having similar functions are denoted by the same reference numerals in different drawings, and explanation thereof will not be repeated.

[Embodiment 1]

In this embodiment, a semiconductor memory device will be described with reference to FIG. 1, FIG. 2, and FIG. 3. The semiconductor memory device includes a memory portion which includes i (i is a natural number) sets each including j (j is a natural number of 2 or larger) arrays each including k (k is a natural number of 2 or larger) lines to each of which a first bit column of an address is assigned in advance; a comparison portion; and a control circuit. Specifically, described in this embodiment is a semiconductor memory device which compares second bit columns of tag fields of the i×j lines to each of which a first bit column of an objective address is assigned in advance with a second bit column of the objective address by the comparison portion more than or equal to once and less than or equal to j times so that the line in which data specified with the address is stored is sought. Then, a cache miss signal or a cache hit signal and main data is/are output from the comparison portion.

<Structure of Semiconductor Memory Device>

A structure of the semiconductor memory device according to one embodiment of the present invention is illustrated in FIG. 1. A semiconductor memory device 500 in FIG. 1 includes a memory portion 510, a comparison portion 520, and a control circuit 530. Note that the semiconductor memory device 500 can be connected to an arithmetic unit 550 as well as a main memory device 560 that is a main memory.

The memory portion 510 stores main data. To the control circuit 530 provided with an external input terminal and an external output terminal, an address 10 for specifying main data is input from the arithmetic unit 550 or the like through the external input terminal. Note that the address 10 includes a first bit column that can be classified into k (k is a natural number of 2 or larger) kinds and a second bit column.

The memory portion 510 includes i (i is a natural number) sets 400_1 to 400_i. Each of the sets includes j (j is a natural number of 2 or larger) arrays 300_1 to 300_j. Each of the arrays includes k lines. Each of the lines includes a tag field and a data field.

The k lines have the k kinds of first bit columns of the address respectively. By selecting the line whose first bit column corresponds to a first bit column of one address and storing a second bit column of the address in the tag field, the first bit column and the second bit column of the address can be stored.

Note that main data that can be specified with the address is stored in the data field of the line.

The comparison portion 520 includes i comparison circuits 522_1 to 522_i and a selection circuit 525. The comparison circuits and the sets form i pairs in total in each of which one comparison circuit and one set are connected to each other.

The control circuit 530 outputs, to all of the i sets provided in the memory portion 510, a line selection signal for selecting the lines corresponding to the first bit column of the address 10 and an array selection signal for selecting one of the j arrays. With the line selection signal and the array selection signal, i lines in total in the i sets provided in the memory portion 510 are specified. The control circuit 530 outputs a second bit column 12 of the address 10 to the comparison circuits provided in the comparison portion 520.

Each of the comparison circuits 522_1 to 522_i provided in the comparison portion compares the second bit column 12 output from the control circuit 530 with the second bit column stored in the tag field of the line specified with the line selection signal and the array selection signal in the set connected to corresponding one of the comparison circuits 522_1 to 522_i. In the case where the second bit columns match each other, a cache hit signal is output to the selection circuit 525. On the other hand, in the case where the second bit columns do not match each other, a cache miss signal is output to the selection circuit 525.

When the cache hit signal is input to the selection circuit 525, the selection circuit 525 outputs, to the control circuit 530, the cash hit signal and main data stored in the data field of the line specified with the line selection signal and the array selection signal in the set connected to the comparison circuit which outputs the cache signal.

When the cache hit signal is input to the control circuit 530, the control circuit 530 outputs the main data 30 and a cache hit signal 20 to the arithmetic unit 550 and the like through the external output terminal.

Note that, after the control circuit 530 outputs a first array selection signal, the control circuit 530 outputs a line selection signal corresponding to the first bit column and an array selection signal to the comparison portion 520 in the order from a second array selection signal to a j-th array selection signal every time the control circuit 530 receives a cache miss signal from the selection circuit 525.

Then, after the comparison portion 520 outputs the cache miss signal in response to the j-th array selection signal, the control circuit outputs the cache miss signal to the arithmetic unit.

<Structure Example 1 of Set>

Figure 2:
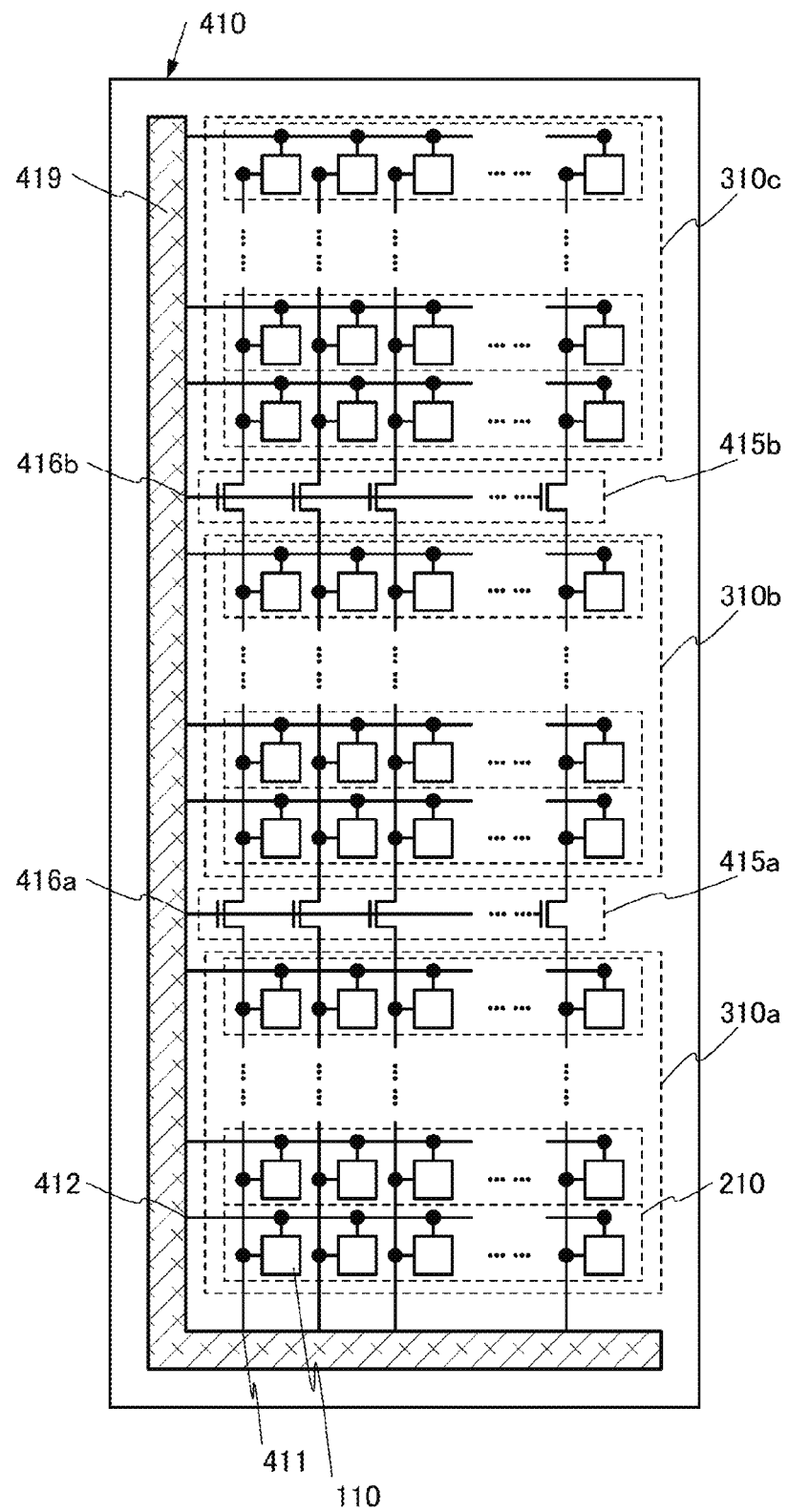
FIG. 2 illustrates a structure of a set provided in a semiconductor memory device according to an embodiment.

A structure of a set that can be used in a semiconductor memory device according to one embodiment of the present invention is illustrated in FIG. 2. Specifically, a structure of a set in which a plurality of arrays are connected in series through switches using transistors will be described.

A set 410 illustrated in FIG. 2 includes a first array 310a, a second array 310b, and a third array 310c. Each of the arrays includes k lines. Each of the lines includes a plurality of cells. For example, a line 210 includes a plurality of cells 110.

The cell is a unit of a memory circuit. A tag field and a data field provided in the line each include a cell. The cell can be formed using a variety of memory elements; for example, the cell can be formed using a DRAM which includes a transistor with an extremely small off-state current (e.g., a transistor including an oxide semiconductor) and a capacitor, an SRAM which will be described in Embodiment 2, or the like.

A plurality of word lines are arranged along one direction in the set 410, and a plurality of bit lines are arranged along another direction. Cells are provided at intersection portions of the word lines and the bit lines in a matrix. For example, the cell 110 is connected to a word line 412 and a bit line 411, and data is read and written from/to the cell 110 by selecting the word line 412 and the bit line 411. Note that a plurality of cells included in one line are connected to one word line. Specifically, a plurality of cells included in the line 210 are connected to the word line 412.

The bit lines are shared by the first array 310a, the second array 310b, and the third array 310c in the set 410 through the switches using transistors.

Specifically, the bit lines connected to the first array 310a are connected to the bit lines connected to the second array 310b through a switch 415a using a plurality of transistors, and the bit lines connected to the second array 310b are connected to the bit lines connected to the third array 310c through a switch 415b using a plurality of transistors.

A method of selecting one cell provided in the second array 310b in the set 410 having the above structure is described. First, an array selection signal for selecting the second array 310b is input to the set 410 together with a line selection signal. Thus, a set driving circuit 419 outputs a signal for turning on the switch 415a in response to the array selection signal to a gate line 416a, and selects one word line connected to the second array 310b in response to the line selection signal.

Then, a method of selecting one cell provided in the third array 310c is described. First, an array selection signal for selecting the third array 310c is input to the set 410 together with a line selection signal. Thus, the set driving circuit 419 outputs a signal for turning on the switches 415a and 415b in response to the array selection signal to the gate line 416a and a gate line 416b, and selects one word line connected to the third array 310c in response to the line selection signal.

When the plurality of arrays are connected in series and thus the bit lines are shared, the wirings can be simplified. As a result, the area occupied by the wirings can be reduced, and miniaturization of the set becomes easy.

Further, the bit lines shared using the switches between the arrays can be disconnected. With such a structure, the lengths of the bit lines connected in series can be changed as needed. As a result, an adverse effect of wiring capacitance of the bit lines which are connected in series and thus have long lengths can be reduced; for example, power consumption due to precharge can be reduced.

<Structure Example 2 of Set>

Figure 3:
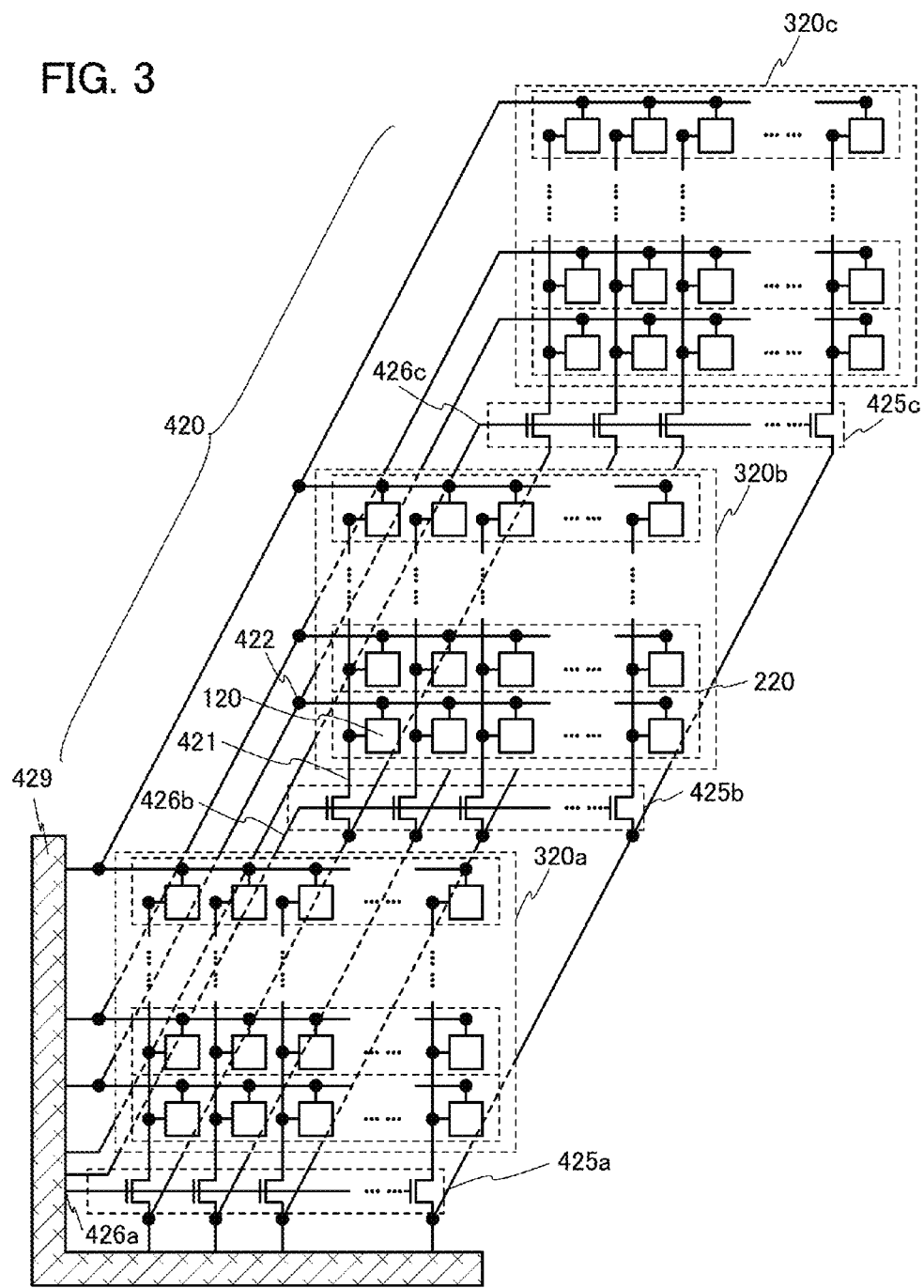
FIG. 3 illustrates a structure of a set provided in a semiconductor memory device according to an embodiment.

Another structure of a set that can be used in a semiconductor memory device according to one embodiment of the present invention is illustrated in FIG. 3. Specifically, a structure of a set in which a plurality of arrays are connected in parallel through switches using transistors will be described.

A set 420 illustrated in FIG. 3 includes a first array 320a, a second array 320b, and a third array 320c. Each of the arrays includes k lines. Each of the lines includes a plurality of cells. For example, a line 220 includes a plurality of cells 120.

A plurality of word lines are arranged along one direction in the set 420, and a plurality of bit lines are arranged along another direction. Cells are provided at intersection portions of the word lines and the bit lines in a matrix. For example, the cell 120 is connected to a word line 422 and a bit line 421, and data is read and written from/to the cell 120 by selecting the word line 422 and the bit line 421. Note that a plurality of cells included in one line are connected to one word line. Specifically, a plurality of cells included in the line 220 are connected to the word line 422.

The first array 320a, the second array 320b, and the third array 320c provided in the set 420 are connected in parallel to a set driving circuit 429 through switches using transistors.

Specifically, the first array 320a is connected to the set driving circuit 429 through a switch 425a using transistors, the second array 320b is connected to the set driving circuit 429 through a switch 425b using transistors, and the third array 320c is connected to the set driving circuit 429 through a switch 425c using transistors.

A method of selecting one cell provided in the first array 320a in the set 420 having the above structure is described. First, an array selection signal for selecting the first array 320a is input to the set 420 together with a line selection signal. Thus, a set driving circuit 429 outputs a signal for turning on the switch 425a in response to the array selection signal to a gate line 426a, and selects one word line connected to the first array 320a in response to the line selection signal.

Then, a method of selecting one cell provided in the second array 320b is described. First, an array selection signal for selecting the second array 320b is input to the set 420 together with a line selection signal. Thus, the set driving circuit 429 outputs a signal for turning on the switch 425b in response to the array selection signal to a gate line 426b, and selects one word line connected to the second array 320b in response to the line selection signal.

Then, a method of selecting one cell provided in the third array 320c is described. First, an array selection signal for selecting the third array 320c is input to the set 420 together with a line selection signal. Thus, the set driving circuit 429 outputs a signal for turning on the switch 425c in response to the array selection signal to a gate line 426c, and selects one word line connected to the third array 320c in response to the line selection signal.

When the plurality of arrays are connected in parallel to the set driving circuit, the wirings connected to the arrays have substantially the same capacitance. As a result, a highly reliable semiconductor memory device which is less likely to malfunction can be provided.

Although the bit lines for connecting the arrays and the set driving circuit are provided with the switches in the set 420, the word lines for connecting the arrays and the set driving circuit may be provided with the switches in the set 420.

A semiconductor memory device according to one embodiment of the present invention having the above structure includes a memory portion that includes i (i is a natural number) sets each including j (j is a natural number of 2 or larger) arrays each including k (k is a natural number of 2 or larger) lines to each of which a first bit column of an address is assigned in advance; a comparison portion; and a control circuit. Second bit columns of tag fields in the i×j lines to each of which a first bit column of an objective address is assigned in advance are compared with a second bit column of the objective address by the comparison portion more than or equal to once and less than or equal to j times so that the line in which data specified with the address is stored is sought. Then, a cache miss signal or a cache hit signal and main data is/are output from the comparison portion.

In this manner, a search of the lines provided in the memory portion can be finished in response to the cache hit signal. Thus, the number of the lines searched before a cache hit is obtained can be reduced, and power consumed in reading operation and comparing operation can be reduced. As a result, a semiconductor memory device in which the frequency of access to a low-speed external memory device is reduced, which operates at high speed, and whose power consumption is reduced can be provided.

This embodiment can be implemented in combination with any of the other embodiments in this specification as appropriate.

[Embodiment 2]

In this embodiment, a method of driving a semiconductor memory device including the following components will be described: a memory portion that includes i (i is a natural number) sets each including j (j is a natural number of 2 or larger) arrays each including k (k is a natural number of 2 or larger) lines to each of which a first bit column of an address is assigned in advance; a comparison portion; and a control circuit. Specifically, a method of driving the semiconductor memory device of Embodiment 1 will be described with reference to FIGS. 4A and 4B, FIG. 5, and FIG. 12, in which second bit columns of tag fields in the i×j lines to each of which a first bit column of an objective address is assigned in advance are compared with a second bit column of the objective address by the comparison portion more than or equal to once and less than or equal to j times so that the line in which data specified with the address is stored is sought, and then a cache miss signal or a cache hit signal and main data is/are output from the comparison portion. In particular, operation of a semiconductor memory device according to one embodiment of the present invention, which includes cells using SRAMs, will be described.

<Structure of Cell>

Figure 4A:
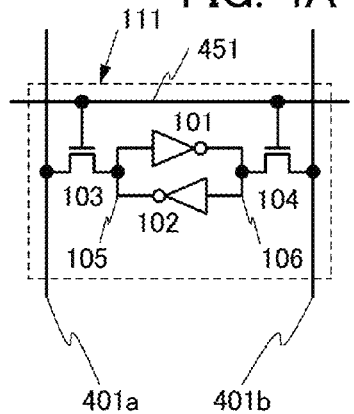
FIGS. 4A and 4B illustrate a structure of a set provided in a semiconductor memory device according to an embodiment.

A structure of a cell included in a semiconductor memory device of this embodiment is illustrated in FIG. 4A. A cell 111 is formed using an SRAM. The cell 111 includes a first inverter 101, a second inverter 102, a first transistor 103, and a second transistor 104. An inverter loop is formed with the first inverter 101 and the second inverter 102. The cell 111 is connected to a word line 451 and a pair of a bit line 401a and an inverted bit line 401b which intersect the word line 451.

<Structure of Set>

Figure 4B:
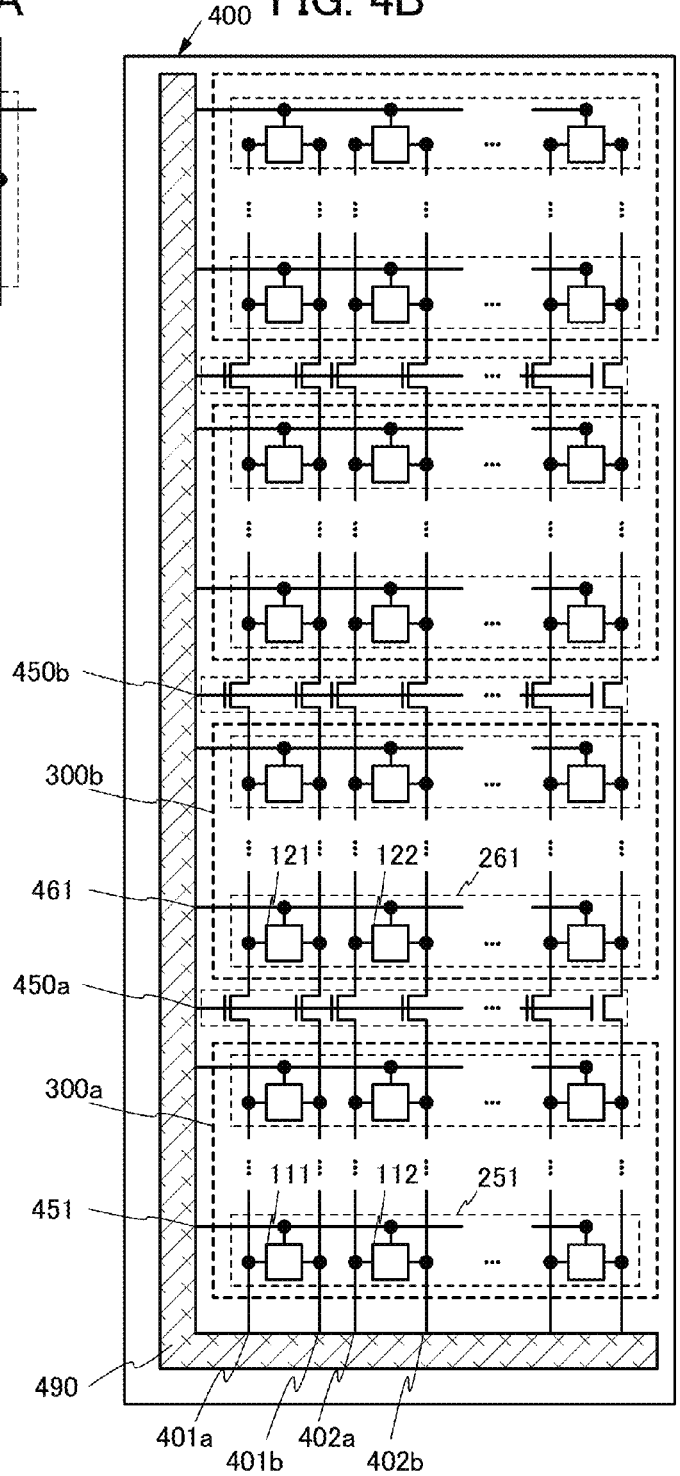

A structure of a set included in the semiconductor memory device of this embodiment is illustrated in FIG. 4B. In the set 400, a plurality of arrays are connected in series through switches using transistors. In the set, a plurality of word lines are arranged in parallel, and a plurality of pairs of bit lines and inverted bit lines which intersect the word lines are arranged. The cells are provided at portions where the word lines intersect the bit lines and the inverted bit lines.

For example, the cell 111 is connected to the word line 451 and the pair of the bit line 401a and the inverted bit line 401b. A cell 112 is connected to the word line 451 and a pair of a bit line 402a and an inverted bit line 402b. A cell 121 is connected to a word line 461 and the pair of the bit line 401a and the inverted bit line 401b. A cell 122 is connected to the word line 461 and the pair of the bit line 402a and the inverted bit line 402b.

The bit lines and the inverter bit lines are shared by a first array 300a and a second array 300b in the set 400 through the switches using transistors.

Specifically, the bit lines and the inverted bit lines connected to the first array 300a and the bit lines and the inverted bit lines connected to the second array 300b are connected to each other through the switches using a plurality of transistors.

The set 400 includes a set driving circuit 490. The set driving circuit 490 outputs a signal for turning on the switch to a gate line in response to an array selection signal, and selects one word line connected to the array selected in response to a line selection signal.

In the set driving circuit 490, a precharge circuit or a differential amplifier circuit for reading data or a buffer circuit for writing data can be provided as well as a row decoder specifying a line.

<First Step>

First, the arithmetic unit outputs an address having a first bit column and a second bit column to the semiconductor memory device according to one embodiment of the present invention.

The control circuit outputs, to the memory portion, a line selection signal for selecting lines corresponding to the first bit column and a first array selection signal for selecting the first array. The second bit column is output to i comparison circuits provided in the comparison portion.

In each of the i sets provided in the memory portion, the first array is selected with the first array selection signal. The first line in the array selected with the first array selection signal is selected with the line selection signal.

The operation of the set 400 is described with reference to a timing chart of FIG. 5 and a flow chart of FIG. 12. Note that in FIG. 5, a signal 1501 corresponds to a signal transmitted through the first word line 451, a signal 1502 corresponds to a signal transmitted through the second word line 461, and a signal 1503 corresponds to a signal transmitted through a first gate line 450a. A signal 1504 corresponds to a signal transmitted through the first bit line 401a, a signal 1505 corresponds to a signal transmitted through the first inverted bit line 401b, a signal 1506 corresponds to a signal transmitted through the second bit line 402a, and a signal 1507 corresponds to a signal transmitted through the second inverted bit line 402b. A signal 1508 corresponds to a signal output from a first output signal line 118, a signal 1509 corresponds to a signal output from a second output signal line 119, a signal 1510 corresponds to a signal input to a first input signal line 125, and a signal 1511 corresponds to a signal input to a second input signal line 126.

The following describes the case where, in an initial state, a first node 105 in the cell 111 illustrated in FIG. 4A stores data "High" (H) (a second node 106 in the cell 111 stores data "Low" (L)), the first node 105 in the cell 112 stores data L (the second node 106 in the cell 112 stores data H), the first node 105 in the cell 121 stores data L (the second node 106 in the cell 121 stores data H), and the first node 105 in the cell 122 stores data H (the second node 106 in the cell 122 stores data L).

Before a time T1, the potentials of the first bit line 401a (the signal 1504), the first inverted bit line 401b (the signal 1505), the second bit line 402a (the signal 1506), and the second inverted bit line 402b (the signal 1507) are set to intermediate potentials in advance (this operation is also referred to as precharge operation).

Between the time T1 and a time T2, the potential of the first word line 451 (the signal 1501) is set to H. Accordingly, the potential of the first bit line 401a (the signal 1504) is changed to H in response to the potential (H) of the first node 105 in the first cell 111, and the potential of the first inverted bit line 401b (the signal 1505) is changed to L in response to the potential (L) of the second node 106 in the first cell 111. Further, the potential of the second bit line 402a (the signal 1506) is changed to L in response to the potential (L) of the first node 105 in the second cell 112, and the potential of the second inverted bit line 402b (the signal 1507) is changed to H in response to the potential (H) of the second node 106 in the second cell 112.

At the time T2, the set driving circuit 490 receives signals of the first bit line 401a (the signal 1504) and the first inverted bit line 401b (the signal 1505), and outputs corresponding data (H) to the first output signal line 118 (the signal 1508). Further, the set driving circuit 490 receives signals of the second bit line 402a (the signal 1506) and the second inverted bit line 402b (the signal 1507), and outputs corresponding data (L) to the second output signal line 119 (the signal 1509). In this manner, the set driving circuit 490 reads data stored in the first line in the first array (first reading 51 in FIG. 12). Note that data stored in the tag field in the first line is output to the comparison circuit connected to the first cell.

<Second Step>

Each of the i comparison circuits provided in the comparison portion compares data read from the tag field in the line corresponding to the first bit column of the address with the second bit column of the address output from the control circuit in the first step (comparison 52 in FIG. 12).

When the data read from the tag field and the second bit column of the address match each other, the comparison circuit outputs a cache hit signal to the selection circuit. When they do not match each other, the comparison circuit outputs a cache miss signal to the selection circuit.

<Third Step>

The selection circuit outputs the cache hit signal and main data from the data field in the corresponding line provided in the array in the set connected to the comparison circuit which has output the cache hit signal. Then, the process proceeds to a sixth step (output of main data 53 in FIG. 12). In the other cases, the process proceeds to a fourth step.

<Fourth Step>

In the case where the line whose data stored in the tag field matches the second bit line is not found in any of the sets connected to the comparison circuits in the comparison portion, the comparison circuit outputs a cache miss signal to the control circuit.

<Fifth Step>

In the case where not all of the i arrays have been selected, the control circuit outputs an array selection signal for selecting one of the arrays which have not been selected to the memory portion in response to the cache miss signal, and outputs the second bit column of the address to the comparison portion. Then, the process returns to the second step. Specifically, in the case where the array selected with the first array selection signal outputs a cache miss signal, the control circuit outputs a second array selection signal, and then the process returns to the second step. Further, in the case where the array selected with the second array selection signal outputs a cache miss signal, the control circuit outputs a third array selection signal, and then the process returns to the third step. In this manner, array selection signals up to a j-th array selection signal are sequentially output to the comparison portion, and the process returns to the second step repeatedly (determination 54 and p-th (p is a natural number larger than or equal to 1 and smaller than or equal to j) reading 55 in FIG. 12). Note that since the address to be sought is not changed, a line selection signal does not need to be output again; however, a line selection signal may be output every time the array selection signal is output. After all of the i arrays in the memory portion are selected, the process proceeds to the sixth step.

In the set 400 of this embodiment, the plurality of arrays are connected in series through the switches using transistors. In the case where any one of the second to j-th arrays is selected from such a set, a gate signal for controlling the switches using transistors is output together with an array selection signal so that the bit line and the inverted bit line connected to the target array are connected to the set driving circuit 490.

Figure 5:
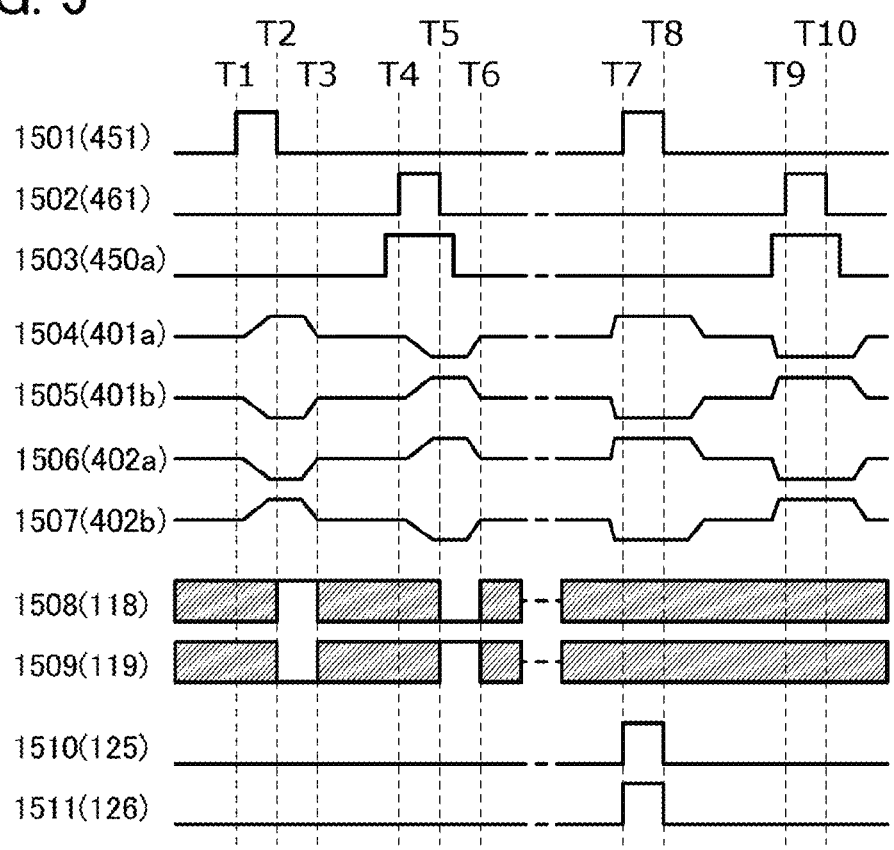
FIG. 5 is a timing chart showing operation of a semiconductor memory device according to an embodiment.

For example, when the second array 300*b* is selected, the potential of the first gate line 450*a* (the signal 1503) is set to H between a time T3 and a time T4 so that the first array 300*a* and the second array 300*b* are connected in series (see FIG. 5).

The potentials of the first bit line 401*a* (the signal 1504), the first inverted bit line 401*b* (the signal 1505), the second bit line 402*a* (the signal 1506), and the second inverted bit line 402*b* (the signal 1507) are set to the intermediate potentials in advance.

Next, between the time T4 and a time T5, the potential of the second word line 461 (the signal 1502) is set to H. Accordingly, the potential of the first bit line 401*a* (the signal 1504) is changed to L in response to the potential (L) of the first node 105 in the third cell 121, and the potential of the first inverted bit line 401*b* (the signal 1505) is changed to H in response to the potential (H) of the second node 106 in the third cell 121. Further, the potential of the second bit line 402*a* (the signal 1506) is changed to H in response to the potential (H) of the first node 105 in the fourth cell 122, and the potential of the second inverted bit line 402*b* (the signal 1507) is changed to L in response to the potential (L) of the second node 106 in the fourth cell 122.

At the time T5, the set driving circuit 490 receives signals of the first bit line 401*a* (the signal 1504) and the first inverted bit line 401*b* (the signal 1505), and outputs corresponding data (L) to the first output signal line 118 (the signal 1508). Further, the set driving circuit 490 receives signals of the second bit line 402*a* (the signal 1506) and the second inverted bit line 402*b* (the signal 1507), and outputs corresponding data (H) to the second output signal line 119 (the signal 1509). In this manner, the set driving circuit 490 reads data stored in the first line in the second array. Note that data stored in the tag field in the first line is output to the comparison circuit connected to the first cell.

Each of the i comparison circuits provided in the comparison portion compares data read from the tag field in the line corresponding to the first bit column of the address with the second bit column of the address output from the control circuit in the first step. In such a manner, the process proceeds from the second step to the third step.

<Sixth Step>

In the case where a cache hit signal and main data are input from the selection circuit, the cache hit signal and main data are output from the control circuit to the external output terminal.

The case where a cache miss signal is input from the comparison circuit to the selection circuit when any array of the first to j-th arrays is selected is described. When a cache miss signal is input from the selection circuit in response to a selection signal for selecting the last array (specifically, the j-th array), the control circuit outputs the cache miss signal to the arithmetic unit (output of miss signal 56 in FIG. 12).

In the method of driving the semiconductor memory device according to one embodiment of the present invention, the control circuit searches the i×j lines to each of which the first bit column of the address is assigned in advance more than or equal to once and less than or equal to j times depending on whether the case corresponds to a cache hit or a cache miss, and specifies the line in which corresponding data is stored.

In this manner, a search of the lines provided in the memory portion can be finished in response to the cache hit signal or the cache miss signal. Thus, the number of the lines searched before a cache hit is obtained can be reduced, and power consumed in reading operation and comparing operation can be reduced. As a result, a method of driving a semiconductor memory device in which the frequency of access to a low-speed external memory device is reduced, which operates at high speed, and whose power consumption is reduced can be provided.

<Writing Operation to Line>

In the case where corresponding data is not stored in any of the i×j lines and a cache miss signal is output to the arithmetic unit, the arithmetic unit receives data from the main memory. In the semiconductor memory device according to one embodiment of the present invention, a corresponding line in one of the sets may be selected so that new data from the main memory may be written to that line (rewriting determination 57 in FIG. 12). For selecting a set in which data is rewritten, the following rewriting algorithm can be used, for example: a least recently used (LRU) system in which the least recently used line is determined as a line for storing data and the line is overwritten with new data, a least frequently used (LFU) system in which the least frequently used set is selected, and a first in first out (FIFO) system in which the set where data is stored first is selected. In the case where any of the systems is used, data is held in a set where data rewriting is not performed (data holding 58 in FIG. 12), and data is written to a set where data rewriting is performed (data writing operation 59 in FIG. 12).

Next, writing operation to a set that can be used for the semiconductor memory device according to one embodiment of the present invention is described. The potentials of the first bit line 401*a* (the signal 1504), the first inverted bit line 401*b* (the signal 1505), the second bit line 402*a* (the signal 1506), and the second inverted bit line 402*b* (the signal 1507) are set to intermediate potentials in advance.

For example, in the case where H is written to both the first cell 111 and the second cell 112, the potentials of all the first nodes 105 are set to H and the potentials of all the second nodes 106 are set to L.

Between a time T7 and a time T8, the potential of the first bit line 401*a* (the signal 1504) is set to H and the potential of the first inverted bit line 401*b* (the signal 1505) is set to L. Further, the potential of the second bit line 402*a* (the signal 1506) is set to H and the potential of the second inverted bit line 402*b* (the signal 1507) is set to L. Furthermore, the potential of the first word line 451 (the signal 1501) is set to H.

Accordingly, data can be stored in the first cell 111 and the second cell 112 provided in the first line of the first array 300*a*.

For example, in the case where L is written to both the third cell 121 and the fourth cell 122, the potentials of all the first nodes 105 are set to L and the potentials of all the second nodes 106 are set to H.

First, between the time T8 and a time T9, the potential of the first gate line 450*a* (the signal 1503) is set to H so that the first array 300*a* and the second array 300*b* are connected in series.

Between the time T9 and a time T10, the potential of the first bit line 401*a* (the signal 1504) is set to L and the potential of the first inverted bit line 401*b* (the signal 1505) is set to H. Further, the potential of the second bit line 402*a* (the signal

1506) is set to L and the potential of the second inverted bit line 402b (the signal 1507) is set to H. Furthermore, the potential of the second word line 461 (the signal 1502) is set to H.

Accordingly, data can be stored in the third cell 121 and the fourth cell 122 provided in the first line of the second array 300b.

A semiconductor memory device according to one embodiment of the present invention having the above structure includes a memory portion that includes i (i is a natural number) sets each including j (j is a natural number of 2 or larger) arrays each including k (k is a natural number of 2 or larger) lines to each of which a first bit column of an address is assigned in advance; a comparison portion; and a control circuit. Second bit columns of tag fields in the i×j lines to each of which a first bit column of an objective address is assigned in advance are compared with a second bit column of the objective address by the comparison portion more than or equal to once and less than or equal to j times so that the line in which data specified with the address is stored is sought. Then, a cache miss signal or a cache hit signal and main data is/are output from the comparison portion.

In this manner, a search of the lines provided in the memory portion can be finished in response to the cache hit signal. Thus, the number of the lines searched before a cache hit is obtained can be reduced, and power consumed in reading operation and comparing operation can be reduced. As a result, a semiconductor memory device in which the frequency of access to a low-speed external memory device is reduced, which operates at high speed, and whose power consumption is reduced can be provided.

This embodiment can be implemented in combination with any of the other embodiments in this specification as appropriate.

[Embodiment 3]

In this embodiment, a structure of a memory portion that can be used in a semiconductor memory device according to one embodiment of the present invention will be described with reference to FIG. 6. Specifically, a structure in which a plurality of arrays are connected in series through switches using transistors provided between the plurality of arrays will be described.

Figure 6:
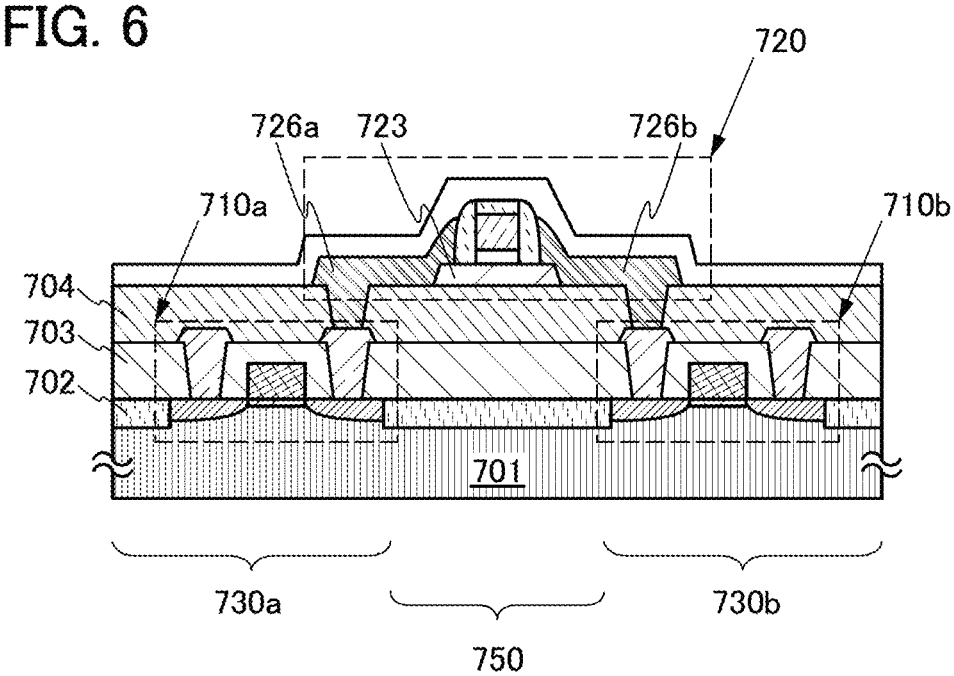
FIG. 6 illustrates a structure of a memory portion that can be used in a semiconductor memory device according to an embodiment.

FIG. 6 is a cross-sectional view of a memory portion that can be used in one embodiment of the present invention. Specifically, the following structure is illustrated: a transistor 710a in a cell provided in a first array 730a and a transistor 710b in a cell provided in a second array 730b are connected in series through a switch 750 including a transistor 720.

The cells in the arrays (specifically, the first array 730a and the second array 730b) in the memory portion of this embodiment include an SRAM. The SRAM includes a transistor in which a channel formation region is formed in a layer of a semiconductor other than an oxide semiconductor. Specifically, both of the cells provided in the first array 730a and the second array 730b are formed on a silicon single crystal substrate 701, the first array 730a includes an SRAM including the transistor 710a, and the second array 730b includes an SRAM including the transistor 710b.

As the semiconductor material other than an oxide semiconductor, for example, silicon, germanium, silicon germanium, silicon carbide, gallium arsenide, or the like can be used. Alternatively, an organic semiconductor material or the like may be used.

Any of the semiconductor materials may include a non-crystalline portion or a crystalline portion. A single crystal semiconductor substrate is preferably used because a transistor capable of high-speed operation can be manufactured.

Alternatively, an SOI substrate or the like can be used. Although the term "SOI substrate" generally means a substrate in which a silicon semiconductor film is provided on an insulating surface, the term "SOI substrate" in this specification and the like also means a substrate in which a semiconductor film including a material other than silicon is provided on an insulating surface. That is, a semiconductor film included in the "SOI substrate" is not limited to a silicon semiconductor film. Further, the SOI substrate includes a substrate having a structure in which a semiconductor film is provided over an insulating substrate such as a glass substrate with an insulating layer provided therebetween.

The transistor 720 in the switch 750 of this embodiment includes, in a channel formation region, a semiconductor material whose bandgap is larger than that (1.12 eV) of a silicon semiconductor. For example, a transistor including a semiconductor material whose bandgap is 2.5 eV or more, preferably 3.0 eV or more in a channel formation region, specifically, a transistor including an oxide semiconductor, a nitride semiconductor, an oxynitride semiconductor, a carbide semiconductor, a diamond thin film exhibiting semiconductor properties, or the like in a channel formation region can be used. A transistor including a semiconductor material whose bandgap is 2.5 eV or more in a channel formation region can have lower off-state leakage current than a transistor including a silicon semiconductor whose bandgap is 1.12 eV in a channel formation region.

The transistor 710a and the transistor 710b are surrounded with an element isolation insulating layer 702, and insulating layers 703 and 704 are provided between the transistor 710a and the transistor 720 and between the transistor 710b and the transistor 720.

An opening reaching one of a source electrode and a drain electrode of the transistor 710a and an opening reaching one of a source electrode and a drain electrode of the transistor 710b are provided in the insulating layers 703 and 704. A first electrode 726a of the transistor 720 and the one of the source electrode and the drain electrode of the transistor 710a are connected to each other through the opening, and a second electrode 726b of the transistor 720 and the one of the source electrode and the drain electrode of the transistor 710b are connected to each other through the opening.

One of bit lines, which are connected to the first array 730a and are not illustrated, is electrically connected to the first electrode 726a of the transistor 720. The other of the bit lines, which are connected to the second array 730b and are not illustrated, is electrically connected to the second electrode 726b of the transistor 720. Therefore, when the transistor 720 is turned on, the one bit line can be electrically connected to the other bit line.

In the memory portion of this embodiment, the switch using the transistor that includes the oxide semiconductor layer is provided over the substrate on which the transistor using a semiconductor other than an oxide semiconductor is formed. With such a structure, for example, a transistor including a semiconductor other than an oxide semiconductor and operating at high speed and a transistor including an oxide semiconductor and having small off-state leakage current can be used in combination. As a result, a switch utilizing advantages of a semiconductor other than an oxide semiconductor and an oxide semiconductor with which off-state leakage current can be reduced, and a memory portion including the switch can be provided.

Accordingly, a semiconductor device in which the frequency of access to a low-speed external memory device is reduced, which operates at high speed, and whose power consumption is reduced can be provided.

This embodiment can be implemented in combination with any of the other embodiments in this specification as appropriate.

[Embodiment 4]

In this embodiment, a structure of a transistor that includes a semiconductor material having a bandgap of 2.5 eV or more in a channel formation region and that can be used for a switch in a semiconductor memory device according to one embodiment of the present invention will be described. Note that a method of manufacturing the transistor of this embodiment will be described in Embodiment 5.

The structure of the transistor of this embodiment is described with reference to FIG. 7D. FIG. 7D illustrates a cross section of the transistor.

A transistor 710 of this embodiment includes, over a substrate 701, a base insulating layer 704, an oxide semiconductor layer 713, a gate insulating layer 712, a gate electrode 711, electrodes 751 and 752 functioning as a source and drain electrodes, and an insulating layer 705 for protecting the transistor.

<Structure of Base Insulating Layer>

The base insulating layer 704 has an insulating surface and serves as a base of the oxide semiconductor layer 713 in which a channel is formed.

The base insulating layer 704 may have either a single-layer structure of a layer including one or more materials selected from silicon oxide, silicon nitride, silicon oxynitride, silicon nitride oxide, aluminum oxide, aluminum nitride, aluminum oxynitride, aluminum nitride oxide, hafnium oxide, gallium oxide, and the like or a layered structure of two or more layers including one or more such materials, for example.

<Oxide Semiconductor Layer>

The oxide semiconductor layer 713 in which a channel is formed overlaps with the gate electrode 711 with the gate insulating layer 712 provided therebetween and is electrically connected to the electrodes 751 and 752 in which the gate electrode 711 is provided therebetween. Note that the electrodes 751 and 752 function as a source and drain electrodes.

The thickness of the oxide semiconductor layer 713 in which a channel is formed is greater than or equal to 2 nm and less than or equal to 200 nm, preferably greater than or equal to 5 nm and less than or equal to 30 nm.

Note that the oxide semiconductor layer 713 is not necessarily processed into an island shape.

The oxide semiconductor layer 713 may be either single crystal or non-single-crystal. In the latter case, the oxide semiconductor layer 713 may have an amorphous structure, a crystalline portion, or a crystalline portion in an amorphous structure. The oxide semiconductor layer 713 may be polycrystalline or non-amorphous.

As an example of a crystalline oxide semiconductor layer, an oxide semiconductor layer having c-axis aligned crystals (CAAC) is given. Note that the oxide semiconductor layer having c-axis aligned crystals will be described in detail in Embodiment 7.

The amount of oxygen in the oxide semiconductor layer 713 is preferably larger than that its stoichiometric amount. When the amount of oxygen is larger than that its stoichiometric amount, generation of carriers caused by oxygen deficiency in a metal oxide layer can be prevented.

The oxide semiconductor layer 713 preferably contains at least indium (In) or zinc (Zn). In particular, In and Zn are preferably contained.

As a stabilizer for reducing a variation in electrical characteristics among transistors including the oxide semiconductor, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Here, for example, an In—Ga—Zn—O-based material means an oxide containing indium (In), gallium (Ga), and zinc (Zn), and there is no particular limitation on the composition ratio. The In—Ga—Zn—O-based material may contain a metal element other than In, Ga, and Zn. For example, the In—Ga—Zn—O-based material may contain $SiO_2$.

Alternatively, a material represented by $InMO_3(ZnO)_m$ (m>0, m is not an integer) may be used as the oxide semiconductor. Note that M represents one or more metal elements selected from Ga, Fe, Mn, and Co. Alternatively, as the oxide semiconductor, a material represented by $In_2SnO_5(ZnO)_n$ (n>0, n is an integer) may be used.

However, the composition is not limited to those described above, and a material having an appropriate composition may be used depending on needed semiconductor characteristics (such as mobility, threshold voltage, and variation). In order to obtain needed semiconductor characteristics, it is preferable that the carrier concentration, the impurity concentration, the defect density, the atomic ratio of a metal element to oxygen, the interatomic distance, the density, and the like be set to appropriate values.

<Gate Insulating Layer>

The gate insulating layer 712 can be formed using silicon oxide, silicon nitride, silicon oxynitride, silicon nitride oxide, gallium oxide, aluminum oxide, aluminum oxynitride, tantalum oxide, or the like.

The gate insulating layer 712 can also be formed using a high dielectric constant (high-k) material. Examples of a high dielectric constant material include hafnium oxide, yttrium oxide, lanthanum oxide, hafnium silicate ($HfSi_xO_y$ (x>0, y>0)), hafnium aluminate ($HfAl_xO_y$ (x>0, y>0)), hafnium silicate to which nitrogen is added ($HfSi_xO_yN_z$ (x>0, y>0, z>0)), and hafnium aluminate to which nitrogen is added ($HfAl_xO_yN_z$ (x>0, y>0, z>0)).

The gate insulating layer 712 may have either a single-layer structure or a layered structure. For example, the gate insulating layer 712 may have a layered structure of a layer containing a high-k material and a layer containing a material selected from silicon oxide, silicon nitride, silicon oxynitride, silicon nitride oxide, aluminum oxide, or the like.

When the gate insulating layer 712 is made thin or formed using the high-k material, the transistor can be miniaturized without sacrificing operating characteristics.

For example, in the case where silicon oxide is used, the thickness of the gate insulating layer 712 can be greater than or equal to 1 nm and less than or equal to 100 nm, preferably greater than or equal to 10 nm and less than or equal to 50 nm.

In the case where a high-k material is used, the transistor can be miniaturized without making the transistor so thin that gate leakage due to a tunneling effect or the like is generated.

The gate insulating layer 712 can be formed using an insulating material containing a Group 13 element and oxygen. Note that an insulating material containing a Group 13 element means an insulating material containing one or more Group 13 elements.

Examples of the insulating material containing a Group 13 element and oxygen include gallium oxide, aluminum oxide, aluminum gallium oxide, and gallium aluminum oxide. Here, the amount of aluminum is larger than that of gallium in atomic percent in aluminum gallium oxide, whereas the amount of gallium is larger than or equal to that of aluminum in atomic percent in gallium aluminum oxide.

Many of oxide semiconductor materials contain a Group 13 element, and an insulating material containing a Group 13 element works well with oxide semiconductor materials. Therefore, with the use of an insulating material containing a Group 13 element and oxygen for an insulating layer in contact with the oxide semiconductor layer, an interface with the oxide semiconductor layer can keep a favorable state.

For example, when a material containing gallium oxide is used for the gate insulating layer that is in contact with the oxide semiconductor layer containing gallium, characteristics at the interface between the oxide semiconductor layer and the gate insulating layer can be kept favorable.

The oxide semiconductor layer and an insulating layer containing gallium oxide are provided in contact with each other, so that pileup of hydrogen at the interface between the oxide semiconductor layer and the insulating layer can be reduced.

For example, it is effective to form an insulating layer with the use of a material containing aluminum oxide. Note that aluminum oxide has a property of not easily transmitting water. Thus, it is preferable to use a material containing aluminum oxide in terms of preventing entry of water into the oxide semiconductor layer.

A similar effect can be obtained in the case where an element in the same group as a constituent element of the oxide semiconductor is used in an insulating layer.

<Gate Electrode>

The gate electrode 711 overlaps with the oxide semiconductor layer 713 with the gate insulating layer 712 provided therebetween, and functions as a gate electrode of the transistor 710.

The gate electrode 711 may have either a single-layer structure of a layer containing a conductive material or a layered structure of two or more layers each containing a conductive material.

Any conductive material may be used as long as it can withstand heat treatment. For example, a metal selected from molybdenum, titanium, tantalum, tungsten, aluminum, copper, neodymium, scandium, or the like, or an alloy containing the metal can be used.

Alternatively, a semiconductor layer typified by a polycrystalline silicon layer doped with an impurity element such as phosphorus, or a silicide layer such as a nickel silicide layer may be used.

<Insulating Layer Over Gate Electrode and Sidewall>

An insulating layer 714a over the gate electrode overlaps with the gate electrode 711 and has insulating properties.

A sidewall 714b is in contact with a side surface of a stack of the gate insulating layer 712, the gate electrode 711, and the insulating layer 714a over the gate electrode, and has insulating properties.

<Source Electrode and Drain Electrode>

The electrodes 751 and 752 are electrically connected to the oxide semiconductor layer 713, and function as a source and drain electrodes of the transistor.

The electrode functioning as the source electrode or the drain electrode may have either a single-layer structure of a layer containing a conductive material or a layered structure of two or more layers each containing a conductive material.

Any conductive material may be used as long as it can withstand heat treatment. For example, a metal selected from aluminum, chromium, copper, titanium, tantalum, molybdenum, or tungsten, or an alloy containing the metal can be used. Alternatively, a metal selected from manganese, magnesium, zirconium, beryllium, neodymium, or scandium, or an alloy containing the metal can be used.

A metal nitride can be used as the conductive material. Specific examples of the metal nitride include titanium nitride, molybdenum nitride, and tungsten nitride.

Alternatively, a conductive metal oxide can be used as the conductive material. Specifically, indium oxide, tin oxide, indium tin oxide (also referred to as ITO), indium zinc oxide, zinc oxide, zinc oxide to which gallium or aluminum is added, or the metal oxide material which contains silicon oxide can be used.

Alternatively, graphene or the like can be used as the conductive material.

For example, the layer including a conductive material can have a single-layer structure of a titanium layer or a titanium nitride layer, a single-layer structure of an aluminum layer containing silicon, a two-layer structure in which a titanium layer is stacked over an aluminum layer, a two-layer structure in which a titanium layer is stacked over a titanium nitride layer, or a three-layer structure in which a titanium layer, an aluminum layer, and a titanium layer are stacked.

Note that the channel length L of the transistor depends on a distance between an edge of the source electrode which is in contact with the oxide semiconductor layer and an edge of the drain electrode which is in contact with the oxide semiconductor layer.

<Insulating Layer for Protecting Transistor>

The insulating layer 705 prevents entry of an impurity such as moisture from the outside to protect the transistor.

The thickness of the insulating layer 705 is at least 1 nm or more.

The insulating layer 705 may have either a single-layer structure of a layer including an insulator having a barrier property or a layered structure of two or more layers each including an insulator having a barrier property.

In particular, a structure in which aluminum oxide is contained is preferable, and a layered structure of an aluminum oxide layer and a layer including another inorganic insulating material may be employed. This is because aluminum oxide does not easily transmit moisture, oxygen, and another impurity.

Alternatively, the insulating layer 705 may have a stack of an oxide insulating layer having an oxygen excess region and an aluminum oxide layer. The oxide insulating layer having an oxygen excess region may be provided on the oxide semiconductor layer side.

For example, a silicon oxide film, a silicon oxynitride film, or the like can be used for the oxide insulating layer having an oxygen excess region.

This embodiment can be implemented in combination with any of the other embodiments in this specification as appropriate.

[Embodiment 5]

In this embodiment, a method of manufacturing the transistor 710 which includes a semiconductor material whose bandgap is 2.5 eV or more in a channel formation region in Embodiment 4 will be described with reference to FIGS. 7A to 7D.

<Formation of Base Insulating Layer>

First, the insulating layer 704 that serves as a base of an oxide semiconductor layer having a channel is formed. The base insulating layer 704 is formed over the substrate 701 by a plasma CVD method, a sputtering method, or the like.

Any substrate can be used as the substrate 701 as long as it has heat resistance high enough to withstand treatment performed after the formation of the base insulating layer, and there is no limitation on the size of the substrate 701.

Another semiconductor element may be provided on the substrate 701 in advance.

For example, a glass substrate such as a barium borosilicate glass substrate or an aluminoborosilicate glass substrate, a ceramic substrate, a quartz substrate, a sapphire substrate, or the like can be used as the substrate 701. Alternatively, a single crystal semiconductor substrate or a polycrystalline semiconductor substrate made of silicon or silicon carbide, a compound semiconductor substrate made of silicon germanium or the like, an SOI substrate, or the like can be used.

A flexible substrate may be used as the substrate 701. A transistor may be directly formed over a flexible substrate. Alternatively, a transistor may be formed over a manufacturing substrate, and then, the transistor may be separated from the manufacturing substrate and transferred to a flexible substrate. Note that in the case where the transistor is separated from the manufacturing substrate and is transferred to the flexible substrate, a separation layer may be provided between the manufacturing substrate and the transistor including an oxide semiconductor layer.

<Formation of Oxide Semiconductor Layer>

Next, the oxide semiconductor layer 713 which has a channel is formed over the base insulating layer 704.

The oxide semiconductor layer can be formed by a sputtering method, a molecular beam epitaxy method, an atomic layer deposition method, or a pulsed laser deposition method.

For example, in the case where an In—Ga—Zn—O-based material is used for the oxide semiconductor, the oxide semiconductor layer can be formed using a target. A variety of materials and a variety of composition ratios can be used as the material and composition ratio of the target. For example, an oxide target having a composition ratio of $In_2O_3:Ga_2O_3:ZnO=1:1:1$ in a molar ratio can be used. Alternatively, an oxide target having a composition ratio of $In_2O_3:Ga_2O_3:ZnO=1:1:2$ in a molar ratio can be used, for example.

In the case where an In—Zn—O-based material is used for the oxide semiconductor, the atomic ratio of metal elements in a target to be used is In:Zn=50:1 to 1:2 in an atomic ratio ($In_2O_3:ZnO=25:1$ to 1:4 in a molar ratio), preferably In:Zn=20:1 to 1:1 in an atomic ratio ($In_2O_3:ZnO=10:1$ to 1:2 in a molar ratio), further preferably In:Zn=15:1 to 1.5:1 in an atomic ratio ($In_2O_3:ZnO=15:2$ to 3:4 in a molar ratio). For example, a target used for formation of an In—Zn—O-based oxide semiconductor has a composition ratio of In:Zn:O=X:Y:Z in an atomic ratio, where Z>1.5X+Y.

For example, in the case where an In—Sn—Zn—O-based material is used for the oxide semiconductor, the oxide semiconductor layer can be formed using a target. A variety of composition ratios can be used as the composition ratio of the target. For example, an oxide target having a composition ratio of In:Sn:Zn=1:2:2 in an atomic ratio can be used. Alternatively, an oxide target having a composition ratio of In:Sn:Zn=2:1:3 in an atomic ratio can be used, for example. Alternatively, an oxide target having a composition ratio of In:Sn:Zn=1:1:1 in an atomic ratio can be used, for example. Alternatively, an oxide target having a composition ratio of In:Sn:Zn=20:45:35 in an atomic ratio can be used, for example.

Note that the relative density of the target is higher than or equal to 90% and lower than or equal to 100%, preferably higher than or equal to 95% and lower than or equal to 99.9%. With the use of a target having high relative density, a dense oxide semiconductor layer can be formed.

Further, the oxide semiconductor layer can be made to be substantially i-type by a decrease in carrier density. Such a method will be described in detail in Embodiment 6.

Figure 7A:
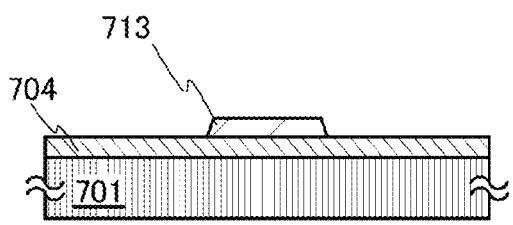
FIGS. 7A to 7D illustrate a method of manufacturing a transistor according to an embodiment.

Then, a resist mask is formed through a photolithography process, and the oxide semiconductor layer is selectively etched using the resist mask to be processed into an island shape (see FIG. 7A).

Note that when the etching is performed while the resist mask is made to recede, an edge of the oxide semiconductor layer can be tapered. When the edge of the island-shaped oxide semiconductor layer is tapered, disconnection of a layer to be formed after this step can be prevented, so that coverage can be improved.

<Formation of Gate Insulating Layer, Gate Electrode, and Insulating Layer Over Gate Electrode>

Then, a stack of the gate insulating layer 712, the gate electrode 711, and the insulating layer 714a over the gate electrode is formed over the oxide semiconductor layer 713.

An insulating layer serving as the gate insulating layer and an insulating layer serving as the insulating layer over the gate electrode are formed by a plasma CVD method, a sputtering method, or the like.

A conductive layer serving as the gate electrode is formed by a sputtering method or the like.

Next, a resist mask is formed through a photolithography process, and the insulating layer serving as the gate insulating layer, the conductive layer serving as the gate electrode, and the insulating layer serving as the insulating layer over the gate electrode are etched using the resist mask so that the stack of the gate insulating layer 712, the gate electrode 711, and the insulating layer 714a over the gate electrode is formed.

<Formation of Sidewall>

Then, the sidewall 714b is formed in contact with a side surface of the stack of the gate insulating layer 712, the gate electrode 711, and the insulating layer 714a over the gate electrode.

An insulating layer serving as a sidewall is formed by a plasma CVD method, a sputtering method, or the like.

Figure 7B:
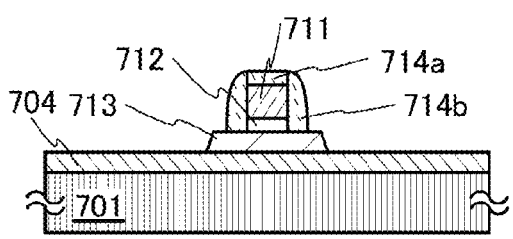

Next, the sidewall is formed by anisotropic etching while the insulating layer which is in contact with the side surface of the stack remains (see FIG. 7B).

<Formation of Electrodes Functioning as Source and Drain Electrodes>

Then, the electrodes 751 and 752 functioning as a source and drain electrodes are formed.

A layer which is to be a source and drain electrodes and contains a conductive material is formed by a sputtering method or the like.

Figure 7C:
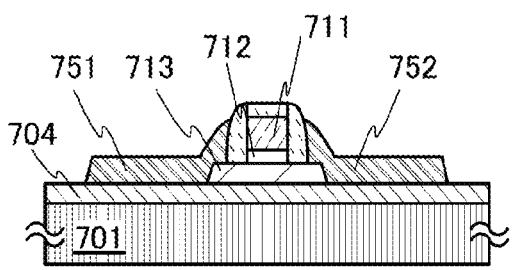
Figure 7D:
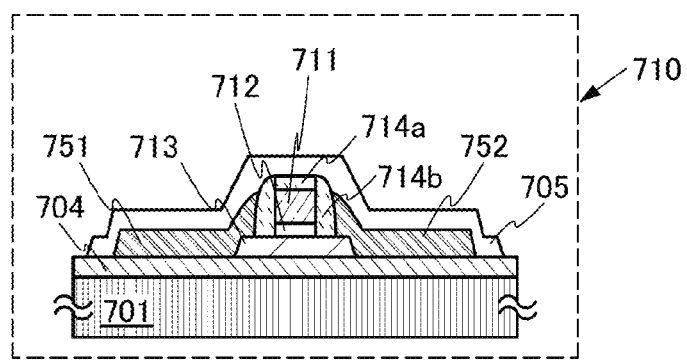

Then, a resist mask is formed through a photolithography process, and the layer containing a conductive material is selectively etched using the resist mask so that the electrodes 751 and 752 are formed (see FIG. 7C). Note that a wiring and the like (not illustrated) made of the layer containing a conductive material are formed in the same step.

Note that in the case where the channel length L of the transistor is greater than or equal to 10 nm and less than or equal to 1000 nm (1 μm), especially less than 25 nm, a mask is preferably formed with an extreme ultraviolet ray whose wavelength is several nanometers to several tens of nanometers. This is because an extreme ultraviolet ray can provide a high resolution and a large focus depth.

Note that edges of the electrodes functioning as a source and drain electrodes are preferably tapered. When the edges of the electrodes functioning as a source and drain electrodes are tapered, disconnection of a layer to be formed after this step (e.g., a gate insulating layer) can be prevented, so that coverage can be improved. The taper angle is preferably greater than or equal to 30° and less than or equal to 60°, for example.

Note that in the case where the layer containing a conductive material has a single-layer structure of a titanium layer or a titanium nitride layer, the layer containing a conductive material can be easily processed into a tapered source and drain electrodes.

<Formation of Insulating Layer for Protecting Transistor>

Next, the insulating layer 705 for protecting the transistor is formed.

The insulating layer for protecting the transistor is formed by a plasma CVD method, a sputtering method, or the like.

Through the above steps, the transistor 710 which includes an oxide semiconductor material in a region where a channel is formed can be obtained.

Note that the resist mask used in this embodiment is not limited to a resist mask formed through a photolithography process. The resist mask can be formed by an inkjet method, a printing method, or the like as appropriate instead of photolithography. When the resist mask is formed without the use of a photomask, the manufacturing cost of a semiconductor device can be reduced.

This embodiment can be implemented in combination with any of the other embodiments in this specification as appropriate.

[Embodiment 6]

In this embodiment, a method of forming an oxide semiconductor layer applicable to a transistor that can be used for a switch included in a semiconductor memory device according to one embodiment of the present invention will be described. Specifically, a method of forming a substantially i-type oxide semiconductor layer whose carrier density is reduced will be described with reference to FIGS. 8A to 8D.

<Structure and Formation Method of Base Insulating Layer>

An insulating layer 504 is formed over a substrate 501. At least a region of an insulating layer 504 serving as a base of an oxide semiconductor layer having a channel, which is in contact with the oxide semiconductor layer, preferably includes an insulating layer from which oxygen is discharged by heat treatment. This is because when the insulating layer 504 has an oxygen excess region, transfer of oxygen from the oxide semiconductor layer to the insulating layer 504 can be prevented and oxygen can be supplied from the insulating layer 504 to the oxide semiconductor layer by heat treatment to be performed later.

In the case where the base insulating layer has a layered structure, an oxide insulating layer having an oxygen excess region is preferably provided on the oxide semiconductor layer side.

For example, the base insulating layer preferably has a structure in which a silicon oxide layer having an oxygen excess region and an aluminum oxide layer are stacked in that order from the oxide semiconductor layer side.

In this specification and the like, the expression "oxygen is discharged by heat treatment" means that the amount of discharged oxygen (or released oxygen) which is converted into oxygen atoms is greater than or equal to $1.0 \times 10^{18}$ cm$^{-3}$, preferably greater than or equal to $3.0 \times 10^{20}$ cm$^{-3}$, in thermal desorption spectroscopy (TDS) analysis. In contrast, the expression "oxygen is not discharged by heat treatment" means that the amount of discharged oxygen (or released oxygen) which is converted into oxygen atoms is less than $1.0 \times 10^{18}$ cm$^{-3}$ in TDS analysis.

As a method of forming an insulating layer from which oxygen is discharged by heat treatment, there are a method of forming an insulating layer in an oxygen atmosphere and a method of forming an insulating layer and then introducing oxygen (including at least any one of an oxygen radical, an oxygen atom, and an oxygen ion), for example.

Oxygen can be introduced by an ion implantation method, an ion doping method, a plasma immersion ion implantation method, plasma treatment, or the like.

<Method 1 of Forming Oxide Semiconductor Layer with Low Impurity Concentration: Deposition>

Figure 8A:
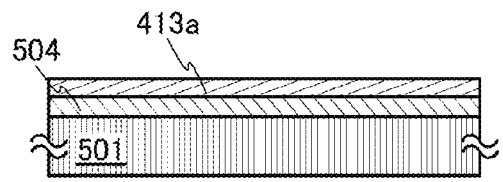
FIGS. 8A to 8D illustrate a method of manufacturing a transistor according to an embodiment.

An oxide semiconductor layer 413a is formed over the base insulating layer 504 (see FIG. 8A). The oxide semiconductor layer 413a is an oxide semiconductor layer in which a channel is formed later; thus, the oxide semiconductor layer 413a is formed so that impurities containing hydrogen atoms are removed as much as possible. This is because the impurity containing a hydrogen atom easily forms a donor level in the oxide semiconductor layer.

Sputtering is preferably used as a method of forming an oxide semiconductor layer in which impurities containing hydrogen atoms are reduced. In particular, it is preferable to use a method in which an insulating layer that is not exposed to the air serves as a base and an oxide semiconductor layer is formed following the formation of the insulating layer.

For example, after impurities containing hydrogen that attach to a surface of the substrate are removed by heat treatment or plasma treatment, the base insulating layer may be formed without exposure to the air, and the oxide semiconductor layer may be successively formed without exposure to the air. In this manner, impurities containing hydrogen that attach to a surface of the base insulating layer can be reduced, and an atmospheric component can be prevented from attaching to an interface between the substrate and the base insulating layer and an interface between the base insulating layer and the oxide semiconductor layer.

Note that before the oxide semiconductor layer is formed by a sputtering method, powder substances (also referred to as particles or dust) which attach to the surface of the base insulating layer are preferably removed by reverse sputtering in which an argon gas is introduced into a treatment chamber and plasma is generated.

The reverse sputtering is a method in which, without application of voltage to a target side, an RF power source is used for application of voltage to a substrate side in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used.

Further, the oxide semiconductor layer is preferably formed using a treatment chamber whose leakage rate is low. Specifically, when the leakage rate of a treatment chamber of a sputtering apparatus is set to $1 \times 10^{-10}$ Pa·m$^3$/s or lower, mixing of impurities such as alkali metal or hydride into the oxide semiconductor layer that is being deposited can be reduced.

Alternatively, the oxide semiconductor layer is preferably formed using a treatment chamber of a sputtering apparatus exhausted by an adsorption vacuum pump (e.g., a cryopump). Counter flow of impurities such as alkali metal, a hydrogen atom, a hydrogen molecule, water, a hydroxyl group, or hydride from an evacuation system can be reduced.

Alternatively, the oxide semiconductor layer is preferably formed under the condition that a high-purity atmosphere gas is supplied to a treatment chamber of a sputtering apparatus. Specifically, oxygen, a high-purity rare gas (typically, argon) from which impurities such as water, a compound having a hydroxyl group, and hydride are removed, or a mixed gas of a rare gas and oxygen is used as appropriate.

For example, the purity of argon is set to 9N (99.9999999%) or higher (the concentration of $H_2O$ is less than 0.1 ppb, and the concentration of $H_2$ is less than 0.5 ppb), and the dew point thereof is set to −121° C. The oxygen concentration is set to 8N (99.999999%) or higher (the concentration of $H_2O$ is less than 1 ppb, and the concentration of $H_2$ is less than 1 ppb), and the dew point thereof is set to −112° C.

In the case where a mixed gas of the rare gas and oxygen is used, the flow rate ratio of oxygen is preferably high.

<<Example of Deposition Condition of Oxide Semiconductor Layer>>

As one example of the deposition condition, the distance between the substrate and the target is 100 mm, the pressure is 0.6 Pa, the direct-current (DC) power source is 0.5 kW, and the atmosphere is an oxygen atmosphere (the proportion of the oxygen flow rate ratio is 100%). Note that a pulsed direct-current (DC) power source is preferable because dust generated in deposition can be reduced and the film thickness can be made uniform.

<Method 2 of Forming Oxide Semiconductor Layer with Low Impurity Concentration: First Heat Treatment>

Figure 8B:
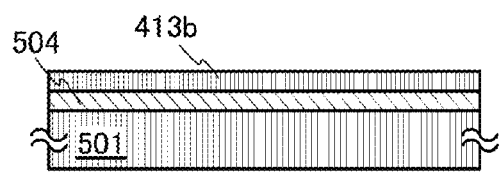
Figure 8C:
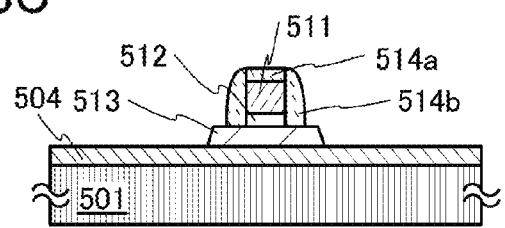

An oxide semiconductor layer 413b from which impurities containing hydrogen atoms are removed as much as possible is formed (see FIG. 8B).

As a method of forming an oxide semiconductor layer in which impurities containing hydrogen atoms are reduced, a method of performing first heat treatment on an oxide semiconductor layer is preferably used in order to reduce impurities such as moisture and hydrogen in the oxide semiconductor layer (in order to perform dehydration or dehydrogenation on the oxide semiconductor layer).

In the case where first heat treatment is performed, an insulating layer from which oxygen is discharged by heat treatment is preferably used as the insulating layer in contact with the oxide semiconductor layer. This is because when the first heat treatment is performed, impurities containing hydrogen atoms and oxygen are released from the oxide semiconductor layer. Some of oxygen deficiencies generated in the oxide semiconductor layer from which oxygen is released serve as donors, and carriers are generated in the oxide semiconductor layer, which might influence the characteristics of the transistor.

The temperature of the first heat treatment is, for example, higher than or equal to 150° C. and lower than the strain point of the substrate, preferably higher than or equal to 250° C. and lower than or equal to 450° C., more preferably higher than or equal to 300° C. and lower than or equal to 450° C.

The first heat treatment time is 3 minutes to 24 hours. It is preferable that the heat treatment time be 24 hours or shorter in order not to reduce the productivity.

The first heat treatment is performed in an oxidizing atmosphere or an inert atmosphere. Here, the oxidizing atmosphere refers to an atmosphere including an oxidation gas such as oxygen, ozone, or nitrogen oxide at 10 ppm or higher. The inert atmosphere refers to an atmosphere which includes the oxidation gas at lower than 10 ppm and is filled with nitrogen or a rare gas.

For example, the first heat treatment is performed in a reduced-pressure atmosphere, an inert gas atmosphere of nitrogen, a rare gas, or the like, an oxygen gas atmosphere, or ultra dry air (the moisture amount is 20 ppm (−55° C. by conversion into a dew point) or lower, preferably 1 ppm or lower, more preferably 10 ppb or lower, in the case where measurement is performed by a dew point meter in a cavity ring-down laser spectroscopy (CRDS) method).

It is preferable that water, hydrogen, and the like be not contained in nitrogen or a rare gas such as helium, neon, or argon. The purity of nitrogen or a rare gas such as helium, neon, or argon which is introduced into a heat treatment apparatus is preferably 6N (99.9999%) or higher, more preferably 7N (99.99999%) or higher (that is, the impurity concentration is 1 ppm or lower, preferably 0.1 ppm or lower).

There is no particular limitation on the heat treatment apparatus used for the first heat treatment. The heat treatment apparatus may be provided with a device for heating an object by thermal conduction or thermal radiation from a heater such as a resistance heater.

For example, an electric furnace, or a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

By the first heat treatment, hydrogen (water or a compound having a hydroxyl group) is released from the oxide semiconductor layer. Further, by the first heat treatment, impurities are reduced so that an i-type (intrinsic) or substantially i-type oxide semiconductor layer can be formed.

Hydrogen that is an unstable carrier source can be discharged from the oxide semiconductor layer by the first heat treatment; thus, a negative shift in the threshold voltage of the transistor can be inhibited. Further, the reliability of the transistor can be improved.

<Modification Example>

After the first heat treatment, oxygen (including at least any one of an oxygen radical, an oxygen atom, and an oxygen ion) may be introduced into the oxide semiconductor layer.

Oxygen can be introduced by an ion implantation method, an ion doping method, a plasma immersion ion implantation method, plasma treatment, or the like.

<Structure and Formation Method of Gate Insulating Layer>

At least a region of a gate insulating layer 512 for covering an oxide semiconductor layer 513 having a channel, which is in contact with the oxide semiconductor layer, preferably includes an insulating layer from which oxygen is discharged by heat treatment. This is because when the gate insulating layer 512 has an oxygen excess region, transfer of oxygen from the oxide semiconductor layer 513 to the gate insulating layer 512 can be prevented and oxygen can be supplied from the gate insulating layer 512 to the oxide semiconductor layer 513 by second heat treatment to be performed later.

In the case where the insulating layer for covering the oxide semiconductor layer having a channel has a layered structure, an oxide insulating layer having an oxygen excess region is preferably provided on the oxide semiconductor layer side.

For example, the insulating layer for covering the oxide semiconductor layer having a channel preferably has a structure in which a silicon oxide layer having an oxygen excess region and an aluminum oxide layer are stacked in that order from the oxide semiconductor layer side.

This is because the aluminum oxide layer does not transmit oxygen and an impurity such as hydrogen or moisture, that is, has a high blocking effect, and can prevent release of oxygen from the oxide semiconductor layer by performing the second heat treatment after the aluminum oxide layer is formed.

<Formation of Gate Insulating Layer, Gate Electrode, and Insulating Layer over Gate Electrode>

Then, a stack of the gate insulating layer 512, a gate electrode 511, and an insulating layer 514a over the gate electrode is formed over the oxide semiconductor layer 513.

An insulating layer serving as the gate insulating layer and an insulating layer serving as the insulating layer over the gate electrode are formed by a plasma CVD method, a sputtering method, or the like.

A conductive layer serving as the gate electrode is formed by a sputtering method or the like.

Next, a resist mask is formed through a photolithography process, and the insulating layer serving as the gate insulating layer, the conductive layer serving as the gate electrode, and the insulating layer serving as the insulating layer over the gate electrode are etched using the resist mask so that the stack of the gate insulating layer 512, the gate electrode 511, and the insulating layer 514a over the gate electrode is formed.

<Formation of Sidewall>

Then, an insulating layer 514b is formed in contact with a sidewall of the stack of the gate insulating layer 512, the gate electrode 511, and the insulating layer 514a over the gate electrode.

An insulating layer serving as a sidewall is formed by a plasma CVD method, a sputtering method, or the like.

Next, the sidewall is formed by anisotropic etching while the insulating layer which is in contact with the side surface of the stack remains.

<Method 1 of Forming Oxide Semiconductor Layer Supplied with Oxygen: Second Heat Treatment>

An oxide semiconductor layer supplied with oxygen is preferably used as the oxide semiconductor layer 513 in which a channel is formed. In particular, an oxide semiconductor layer in which oxygen deficiencies are filled is preferable. This is because some of oxygen deficiencies serve as donors and carriers are generated in the oxide semiconductor layer, which might influence the characteristics of the transistor.

As a method of forming an oxide semiconductor layer supplied with oxygen, there is a method in which the second heat treatment is performed under the condition that an insulating layer from which oxygen is discharged by heat treatment is in contact with an oxide semiconductor layer in which a channel is formed. Specifically, an insulating layer for covering a base insulating layer or/and a region in which a channel is formed may be formed using an insulating layer from which oxygen is discharged by heat treatment, and oxygen may be supplied to the oxide semiconductor layer by the second heat treatment (see FIG. 8C).

Note that the second heat treatment is effective in any step performed after an insulating layer including an insulating layer from which oxygen is discharged by heat treatment is formed in contact with a region of the oxide semiconductor layer in which a channel is formed.

In particular, it is preferable that a layered structure in which a silicon oxide layer having an oxygen excess region and an aluminum oxide layer having a high blocking effect are stacked in that order from the oxide semiconductor layer side be employed and the second heat treatment be performed under the condition that the aluminum oxide layer is formed.

The second heat treatment may be performed in an atmosphere of nitrogen, oxygen, ultra dry air (air in which the water content is 20 ppm or less, preferably 1 ppm or less, more preferably 10 ppb or less), or a rare gas (argon, helium, or the like). Note that it is preferable that water, hydrogen, or the like be not contained in the atmosphere of nitrogen, oxygen, ultra dry air, a rare gas, or the like. It is also preferable that the purity of nitrogen, oxygen, or the rare gas which is introduced into the heat treatment apparatus be set to 6N (99.9999%) or higher, preferably 7N (99.99999%) or higher (that is, the impurity concentration is 1 ppm or lower, preferably 0.1 ppm or lower).

<Method of Measuring Amount of Discharged Oxygen Converted into Oxygen Atoms>

A method of quantifying the amount of released oxygen that is converted into oxygen atoms in TDS analysis is described below.

The amount of discharged gas in the TDS analysis is proportional to an integral value of a spectrum. Thus, from the ratio of the integral value of a spectrum of the insulating layer to a reference value of a standard sample, the amount of discharged gas can be calculated. The reference value of a standard sample is the ratio of density of a predetermined atom contained in a sample to the integral value of a spectrum.

For example, the number of discharged oxygen molecules ($N_{O2}$) from an insulating layer can be found according to Formula 1 with the TDS analysis results of a silicon wafer containing hydrogen at a predetermined density that is the standard sample and the TDS analysis results of the insulating layer. Here, all the spectra having a mass number of 32 that are obtained by the TDS analysis are assumed to originate from an oxygen molecule. Note that $CH_3OH$, which is given as a gas having a mass number of 32, is not taken into consideration on the assumption that it is unlikely to be present. Further, an oxygen molecule including an oxygen atom having a mass number of 17 or 18 that is an isotope of an oxygen atom is not taken into consideration either because the proportion of such a molecule in the natural world is minimal $$N_{O2}=N_{H2}/S_{H2} \times S_{O2} \times \alpha \qquad \text{(Formula 1)}.$$

In the formula, $N_{H2}$ is the value obtained by conversion of the number of hydrogen molecules discharged from the standard sample into density, and $S_{H2}$ is the integral value of a spectrum of the standard sample which is analyzed by TDS. Here, the reference value of the standard sample is set to $N_{H2}/S_{H2}$. Further, $S_{O2}$ is the integral value of a spectrum of the insulating layer which is analyzed by TDS, and $\alpha$ is a coefficient which influences spectrum intensity in the TDS analysis. Japanese Published Patent Application No. H6-275697 can be referred to for details of Formula 1. Note that the above value of the amount of discharged oxygen is obtained by measurement with a thermal desorption spectrometer produced by ESCO Ltd., EMD-WA1000S/W using a silicon wafer containing hydrogen atoms at $1\times10^{16}$ cm$^{-3}$ as the standard sample.

Further, in the TDS analysis, part of oxygen is detected as an oxygen atom. The ratio between oxygen molecules and oxygen atoms can be calculated from the ionization rate of the oxygen molecules. Note that, since the above α includes the ionization rate of the oxygen molecules, the number of the discharged oxygen atoms can also be estimated through the evaluation of the number of the discharged oxygen molecules.

Note that $N_{O2}$ is the number of the discharged oxygen molecules. In the insulating layer, the amount of discharged oxygen when converted into oxygen atoms is twice the number of the discharged oxygen molecules.

As an example of a layer from which oxygen is discharged by heat treatment, a film of oxygen-excess silicon oxide (SiO$_X$(X>2)) is given. In the oxygen-excess silicon oxide (SiO$_X$(X>2)), the number of oxygen atoms per unit volume is more than twice the number of silicon atoms per unit volume. The number of silicon atoms and the number of oxygen atoms per unit volume are measured by Rutherford backscattering spectrometry.

<Formation of Electrodes Functioning as Source and Drain Electrodes>

Then, electrodes 551 and 552 functioning as a source and drain electrodes are formed.

A layer which is to be a source and drain electrodes and contains a conductive material is formed by a sputtering method or the like.

Then, a resist mask is formed through a photolithography process, and the layer containing a conductive material is selectively etched using the resist mask so that the electrodes 551 and 552 are formed. Note that a wiring and the like (not illustrated) made of the layer containing a conductive material are formed in the same step.

Note that in the case where the channel length L of the transistor is greater than or equal to 10 nm and less than or equal to 1000 nm (1 μm), especially less than 25 nm, a mask is preferably formed with an extreme ultraviolet ray whose wavelength is several nanometers to several tens of nanometers. This is because an extreme ultraviolet ray can provide a high resolution and a large focus depth.

Note that edges of the electrodes functioning as a source and drain electrodes are preferably tapered. When the edges of the electrodes functioning as a source and drain electrodes are tapered, disconnection of a layer to be formed after this step (e.g., a gate insulating layer) can be prevented, so that coverage can be improved. The taper angle is preferably greater than or equal to 30° and less than or equal to 60°, for example.

Note that in the case where the layer containing a conductive material has a single-layer structure of a titanium layer or a titanium nitride layer, the layer containing a conductive material can be easily processed into a tapered source and drain electrodes.

<Formation of Insulating Layer for Protecting Transistor>

Next, an insulating layer 505 for protecting the transistor is formed.

Figure 8D:
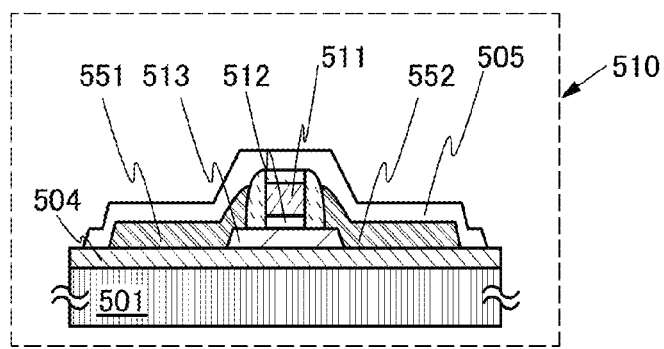

The insulating layer for protecting the transistor is formed by a plasma CVD method, a sputtering method, or the like (see FIG. 8D).

Since generation of carriers in the oxide semiconductor layer in which a channel is formed can be inhibited as described above, changes in transistor characteristics can be inhibited. Further, the off-state leakage current per micrometer of channel width can be as small as $1\times10^{-17}$ A or lower.

This embodiment can be implemented in combination with any of the other embodiments in this specification as appropriate.

[Embodiment 7]

In this embodiment, an oxide semiconductor layer that can be used in a transistor applicable to a switch included in a semiconductor memory device according to one embodiment of the present invention will be described. Specifically, an oxide semiconductor layer having c-axis aligned crystals is described.

In this embodiment, an oxide including a crystal with c-axis alignment (also referred to as c-axis aligned crystal (CAAC)), which has a triangular or hexagonal atomic arrangement when seen from the direction of an a-b plane, a surface, or an interface, will be described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an oxide including CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a substrate over which the CAAC is formed, and in which metal atoms are arranged in a layered manner or metal atoms and oxygen atoms (or nitrogen atoms) are arranged in a layered manner when a cross section of the film is observed.

The CAAC is described in detail with reference to FIGS. 9A to 9E, FIGS. 10A to 10C, and FIGS. 11A to 11C. In FIGS. 9A to 9E, FIGS. 10A to 10C, and FIGS. 11A to 11C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 9A to 9E, O surrounded by a circle represents tetracoordinate O and a double circle represents tricoordinate O.

Figure 9A:
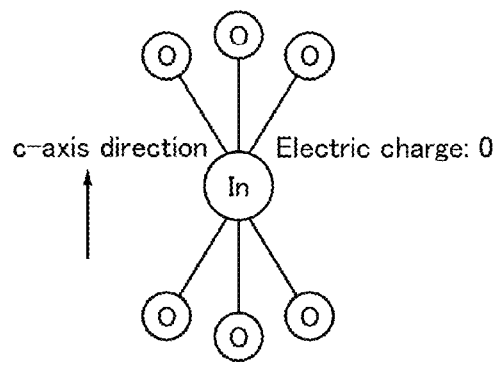
FIGS. 9A to 9E illustrate structures of oxide materials according to an embodiment.

FIG. 9A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 9A is actually an octahedral structure, but is illustrated as a planar structure for simplicity. Note that three tetracoordinate O atoms exist in each of an upper half and a lower half in FIG. 9A. In the small group illustrated in FIG. 9A, electric charge is 0.

Figure 9D:
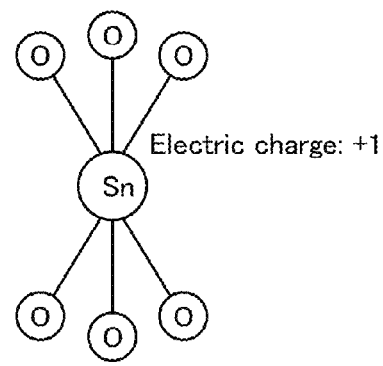
Figure 9B:
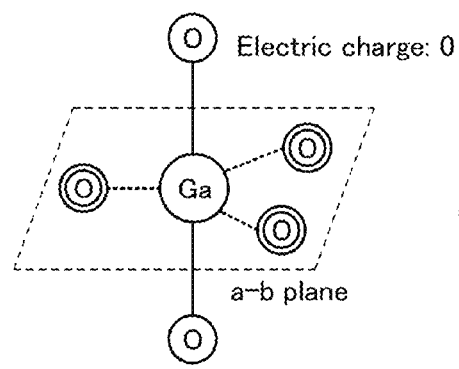

FIG. 9B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 9B. An In atom can also have the structure illustrated in FIG. 9B because an In atom can have five ligands. In the small group illustrated in FIG. 9B, electric charge is 0.

Figure 9E:
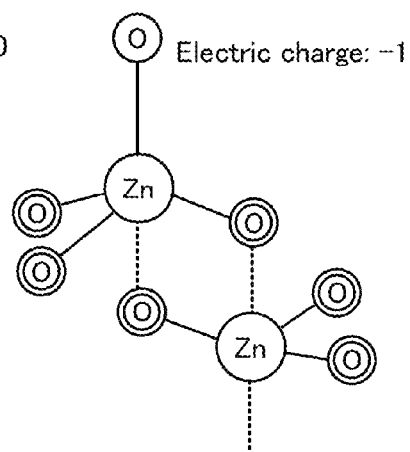
Figure 9C:
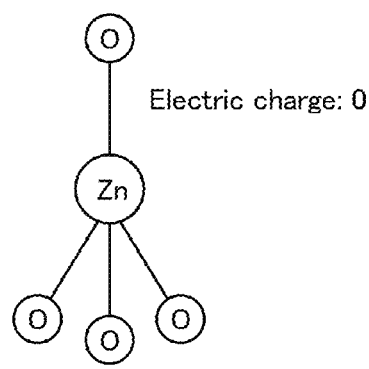

FIG. 9C illustrates a structure including one tetracoordinate Zn atom and four tetracoordinate O atoms proximate to the Zn atom. In FIG. 9C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 9C. In the small group illustrated in FIG. 9C, electric charge is 0.

FIG. 9D illustrates a structure including one hexacoordinate Sn atom and six tetracoordinate O atoms proximate to the Sn atom. In FIG. 9D, three tetracoordinate O atoms exist in each of an upper half and a lower half In the small group illustrated in FIG. 9D, electric charge is +1.

FIG. 9E illustrates a small group including two Zn atoms. In FIG. 9E, one tetracoordinate O atom exists in each of an upper half and a lower half. In the small group illustrated in FIG. 9E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 9A each have three proximate In atoms in the downward direction, and the three O atoms in the lower half each have three proximate In atoms in the upward direction. The one O atom in the upper half with respect to the pentacoordinate Ga atom in FIG. 9B has one proximate Ga atom in the downward direction, and the one O atom in the lower half has one proximate Ga atom in the upward direction. The one O atom in the upper half with respect to the tetracoordinate Zn atom in FIG. 9C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. The reason is described below. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 10A:
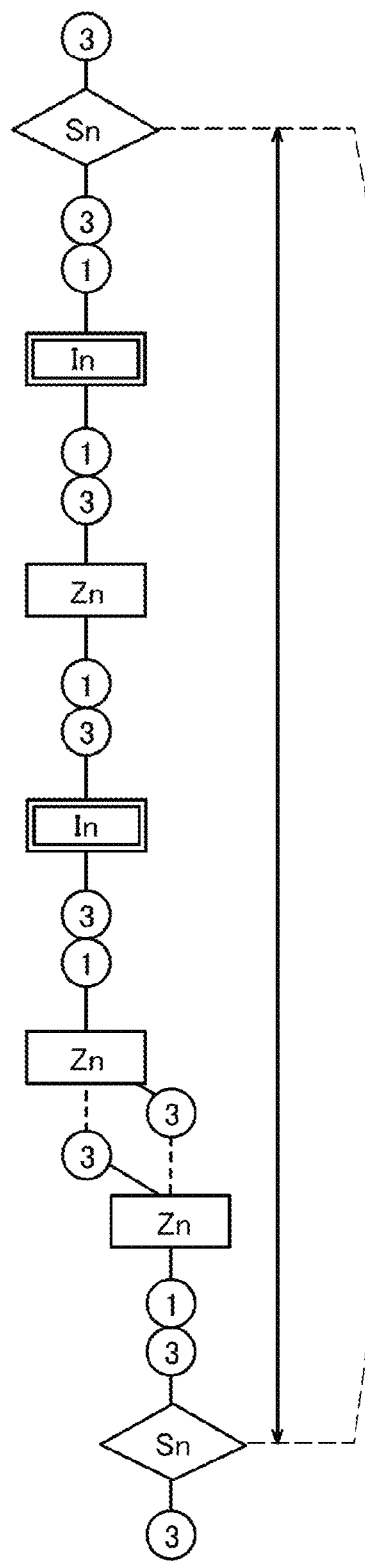
FIGS. 10A to 10C illustrate a structure of an oxide material according to an embodiment.
Figure 10B:
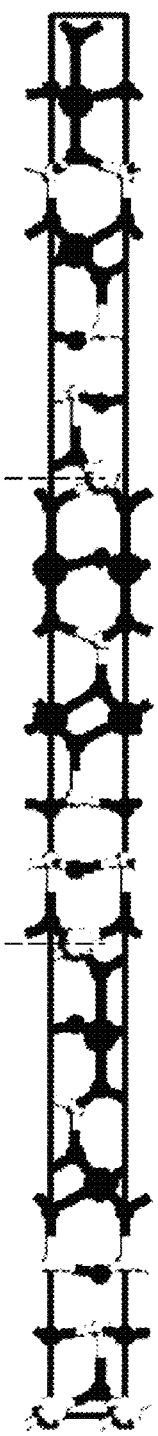
Figure 10C:
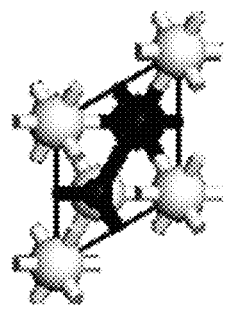

FIG. 10A illustrates a model of a medium group included in a layered structure of an In—Sn—Zn—O-based material. FIG. 10B illustrates a large group including three medium groups. Note that FIG. 10C illustrates an atomic arrangement in the case where the layered structure in FIG. 10B is observed from the c-axis direction.

In FIG. 10A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 10A, one tetracoordinate O atom existing in each of an upper half and a lower half with respect to an In atom is denoted by circled 1. FIG. 10A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 10A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 9E can be given. For example, with one small group including two Zn atoms, electric charge of one small group including a Sn atom can be cancelled, so that the total electric charge of the layered structure can be 0.

When the large group illustrated in FIG. 10B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn—O-based oxide; a three-component metal oxide such as an In—Ga—Zn—O-based oxide (also referred to as IGZO), an In—Al—Zn—O-based oxide, a Sn—Ga—Zn—O-based oxide, an Al—Ga—Zn—O-based oxide, a Sn—Al—Zn—O-based oxide, an In—Hf—Zn—O-based oxide, an In—La—Zn—O-based oxide, an In—Ce—Zn—O-based oxide, an In—Pr—Zn—O-based oxide, an In—Nd—Zn—O-based oxide, an In—Sm—Zn—O-based oxide, an In—Eu—Zn—O-based oxide, an In—Gd—Zn—O-based oxide, an In—Tb—Zn—O-based oxide, an In—Dy—Zn—O-based oxide, an In—Ho—Zn—O-based oxide, an In—Er—Zn—O-based oxide, an In—Tm—Zn—O-based oxide, an In—Yb—Zn—O-based oxide, or an In—Lu—Zn—O-based oxide; a two-component metal oxide such as an In—Zn—O-based oxide, a Sn—Zn—O-based oxide, an Al—Zn—O-based oxide, a Zn—Mg—O-based oxide, a Sn—Mg—O-based oxide, an In—Mg—O-based oxide, or an In—Ga—O-based oxide; and the like.

Figure 11A:
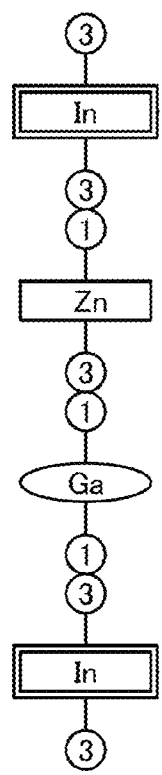
FIGS. 11A to 11C illustrate a structure of an oxide material according to an embodiment.

As an example, FIG. 11A illustrates a model of a medium group included in a layered structure of an In—Ga—Zn—O-based material.

In the medium group included in the layered structure of the In—Ga—Zn—O-based material in FIG. 11A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 11B:
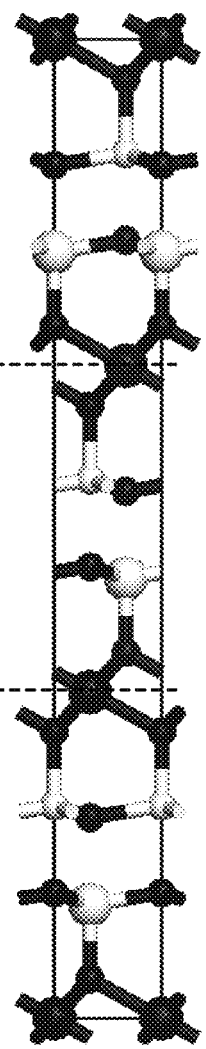
Figure 11C:
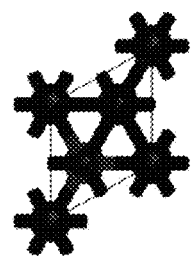

FIG. 11B illustrates a large group including three medium groups. Note that FIG. 11C illustrates an atomic arrangement in the case where the layered structure in FIG. 11B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 11A but also a medium group in which the arrangement of the In atom, the Ga atom, and the Zn atom is different from that in FIG. 11A.

When a transistor according to one embodiment of the present invention includes an oxide semiconductor layer having CAAC in a channel formation region, the transistor can have high reliability, which is preferable.

This embodiment can be implemented in combination with any of the other embodiments in this specification as appropriate.

This application is based on Japanese Patent Application serial no. 2011-129142 filed with Japan Patent Office on Jun. 9, 2011, the entire contents of which are hereby incorporated by reference.

What is claimed is:

1. A semiconductor memory device comprising:
a memory portion comprising i (i is a natural number) sets each comprising j (j is a natural number of 2 or larger) arrays each comprising k (k is a natural number of 2 or larger) lines each comprising a tag field and a data field;
a comparison portion comprising i comparison circuits and a selection circuit to which the i comparison circuits and the i sets are connected; and
a control circuit that is connected to the selection circuit and comprises an external input terminal through which an address and/or main data specified with the address are/is input and an external output terminal through which a cache miss signal or a cache hit signal and main data is/are output,
wherein the i sets and the i comparison circuits are each connected to the control circuit,
wherein each of the i sets is connected to a corresponding comparison circuit among the i comparison circuits,
wherein a first bit column of the address is assigned to a corresponding line among the k lines,
wherein a second bit column of the address is stored in the tag field of the corresponding line,
wherein the main data specified with the address is stored in the data field of the corresponding line,
wherein the comparison portion compares a second bit column of a tag field of each line selected by the control circuit with a second bit column of an address input from the control circuit, and outputs a cache miss signal to the control circuit when the second bit column of the tag field and the second bit column of the address input from the control circuit do not match each other or outputs a cache hit signal and main data stored in a data field of a line to the control circuit when the second bit column of the tag field and the second bit column of the address input from the control circuit match each other,
wherein, in response to an address signal input through the external input terminal or the cache miss signal input from the comparison portion, the control circuit outputs, to the memory portion, a line selection signal for selecting the lines to each of which the first bit column of the input address is assigned and an array selection signal for selecting one of the j arrays in sequence, and outputs the second bit column of the input address to the comparison circuit,
wherein the cache miss signal is output through the external output terminal in response to the cache miss signal input from the comparison portion after all of the j arrays are selected with the array selection signal, and
wherein the cache hit signal and the main data are output through the external output terminal in response to the cache hit signal input from the comparison portion.

2. The semiconductor memory device according to claim 1, wherein, in each of the sets, the j arrays are connected in series through a switch comprising a transistor.

3. The semiconductor memory device according to claim 1, wherein, in each of the sets, the j arrays are connected in parallel through a switch comprising a transistor.

4. The semiconductor memory device according to claim 2, wherein the transistor comprises an oxide semiconductor layer comprising a channel formation region.

5. The semiconductor memory device according to claim 3, wherein the transistor comprises an oxide semiconductor layer comprising a channel formation region.

6. The semiconductor memory device according to claim 1, wherein each of the k lines in the j arrays comprises a plurality of SRAMs.

7. A method of driving a semiconductor memory device, comprising:
- a first step in which an address is input through an external input terminal of a control circuit comprising the external input terminal and an external output terminal, the control circuit outputs, to a memory portion comprising i (i is a natural number) sets each comprising j (j is a natural number of 2 or larger) arrays each comprising k (k is a natural number of 2 or larger) lines each of which comprises a tag field and a data field and to which k kinds of first bit columns of an address are assigned in advance, an array selection signal for selecting one of the j arrays in the memory portion and a line selection signal for selecting the line corresponding to the address from the k lines, and a second bit column of the address is output to a comparison portion which comprises i comparison circuits and a selection circuit to which the i comparison circuits and the i sets are connected, each of the i sets being connected to a corresponding comparison circuit among the i comparison circuits;
- a second step in which the i comparison circuits of the comparison portion compare second bit columns of the tag fields of the selected i lines with the second bit column of the address input from the control circuit, and the comparison circuit outputs a cache hit signal to the selection circuit when the second bit column of the tag field and the second bit column of the address input from the control circuit match each other or outputs a cache miss signal to the selection circuit when the second bit column of the tag field and the second bit column of the address input from the control circuit do not match each other;
- a third step in which the selection circuit outputs main data stored in the data field of the line comprising the tag field whose second bit column matches the second bit column of the address input from the control circuit in the set connected to the comparison circuit which has output the cache hit signal;
- a fourth step in which, when all of the i comparison circuits output a cache miss signal, the comparison portion outputs the cache miss signal to the control circuit;
- a fifth step in which the control circuit outputs an array selection signal for selecting one of the arrays which have not been selected and the line selection signal to the memory portion and outputs the second bit column of the address to the comparison portion; and
- a sixth step in which the control circuit outputs, through the external output terminal, the cache hit signal and the main data or the cache miss signal input from the selection circuit,
- wherein, in a case where one of the i comparison circuits outputs a cache hit signal, the fourth step and the fifth step are skipped so that the sixth step follows the third step, and in the other cases, the fourth step follows the third step, and
- wherein, in a case where not all of the j arrays in the memory portion have been selected in the fifth step, a process returns to the second step, and after all of the j arrays in the memory portion are selected, the sixth step follows the fifth step.

8. A semiconductor memory device comprising:
- a memory portion comprising a first set and a second set;
- a comparison portion comprising a first comparison circuit, a second comparison circuit and a selection circuit; and
- a control circuit,
- wherein each of the first set and the second set comprises a first array and a second array,
- wherein each of the first array and the second array comprises a plurality of lines,
- wherein each of the plurality of lines comprises a tag field and a data field,
- wherein the first comparison circuit is configured to compare a first data element from the tag field of a corresponding line among the plurality of lines of the first array of the first set and a second data element from the control circuit and output a first cache hit signal to the selection circuit in the case where the first data element matches the second data element and a first cache miss signal to the selection circuit in the case where the first data element does not match the second data element, and then compare a third data element from the tag field of a corresponding line among the plurality of lines of the second array of the first set and the second data element from the control circuit in the case where the first data element does not match the second data element, and
- wherein the second comparison circuit is configured to compare a fourth data element from the tag field of a corresponding line among the plurality of lines of the first array of the second set and the second data element from the control circuit and output a second cache hit signal to the selection circuit in the case where the fourth data element matches the second data element and a second cache miss signal to the selection circuit in the case where the fourth data element does not match the second data element, and then compare a fifth data element from the tag field of a corresponding line among the plurality of lines of the second array of the second set and the second data element from the control circuit in the case where the fourth data element does not match the second data element.

9. The semiconductor memory device according to claim 8, wherein each of the plurality of lines in comprises a plurality of SRAMs.

10. A semiconductor memory device comprising:
- a memory portion comprising a first set and a second set;
- a comparison portion comprising a first comparison circuit, a second comparison circuit and a selection circuit; and
- a control circuit,
- wherein each of the first set and the second set comprises a first array, a plurality of first transistors, a second array and a plurality of second transistors,
- wherein each of the first array and the second array comprises a plurality of lines,
- wherein each of the plurality of lines comprises a tag field and a data field,
- wherein the first array and the second array are electrically connected to each other via transistors,
- wherein the first comparison circuit is configured to compare a first data element from the tag field of a corresponding line among the plurality of lines of the first array of the first set and a second data element from the control circuit and output a first cache hit signal to the selection circuit in the case where the first data element matches the second data element and a first cache miss signal to the selection circuit in the case where the first data element does not match the second data element, and then compare a third data element from the tag field of a corresponding line among the plurality of lines of the second array of the first set and the second data element from the control circuit in the case where the first data element does not match the second data element, wherein the plurality of first transistors are configured to be turned on in the case where the first data element does not match the second data element, wherein the second comparison circuit is configured to compare a fourth data element from the tag field of a corresponding line among the plurality of lines of the first array of the second set and the second data element from the control circuit and output a second cache hit signal to the selection circuit in the case where the fourth data element matches the second data element and a second cache miss signal to the selection circuit in the case where the fourth data element does not match the second data element, and then compare a fifth data element from the tag field of a corresponding line among the plurality of lines of the second array of the second set and the second data element from the control circuit in the case where the fourth data element does not match the second data element, and wherein the plurality of second transistors are configured to be turned on in the case where the fourth data element does not match the second data element.

11. The semiconductor memory device according to claim 10, wherein each of the transistors comprises an oxide semiconductor layer comprising a channel formation region.

12. The semiconductor memory device according to claim 10, wherein each of the plurality of lines in comprises a plurality of SRAMs.

* * * * *